US012813074B2

(12) United States Patent
Li et al.

(10) Patent No.: US 12,813,074 B2
(45) Date of Patent: Nov. 24, 2026

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN); Beijing BOE Technology Development Co., Ltd., Beijing (CN)

(72) Inventors: Haoyu Li, Beijing (CN); Ling Shi, Beijing (CN); Youchun Chen, Beijing (CN); Hongbo Ma, Beijing (CN); Lujiang Huangfu, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 51 days.

(21) Appl. No.: 18/996,595

(22) PCT Filed: Apr. 3, 2024

(86) PCT No.: PCT/CN2024/085993
§ 371 (c)(1),
(2) Date: Jan. 17, 2025

(87) PCT Pub. No.: WO2025/208455
PCT Pub. Date: Oct. 9, 2025

(65) Prior Publication Data

US 2026/0045213 A1 Feb. 12, 2026

(30) Foreign Application Priority Data

Apr. 1, 2024 (WO) ................ PCT/CN2024/085180

(51) Int. Cl.
*H10K 59/121* (2023.01)
*G09G 3/3233* (2016.01)
*H10K 59/131* (2023.01)

(52) U.S. Cl.
CPC ....... *H10K 59/1213* (2023.02); *G09G 3/3233* (2013.01); *H10K 59/131* (2023.02);
(Continued)

(58) Field of Classification Search
CPC ......... G09G 3/3233; G09G 2300/0426; G09G 2300/0819
(Continued)

(56) References Cited

U.S. PATENT DOCUMENTS

2022/0238612 A1* 7/2022 Shi .................. H10K 59/80515
2022/0320220 A1 10/2022 Wang et al.
(Continued)

FOREIGN PATENT DOCUMENTS

CN 109859687 A 6/2019
CN 111739916 A 10/2020
(Continued)

*Primary Examiner* — Mark Edwards
(74) *Attorney, Agent, or Firm* — Westman, Champlin & Koehler, P.A.

(57) ABSTRACT

A display substrate is provided, including: a base substrate; a plurality of sub-pixels on the base substrate, the sub-pixel including a light-emitting element and a driving circuit; a first initialization signal transmission structure electrically connected to the driving circuit; a second initialization signal transmission structure electrically connected to the driving circuit; a reference voltage signal transmission structure electrically connected to the driving circuit; a second power signal transmission structure electrically connected to a second electrode of the light-emitting element. An orthographic projection of at least one of the first initialization signal transmission structure, the second initialization signal
(Continued)

transmission structure, the reference voltage signal transmission structure or the second power signal transmission structure on the base substrate is in a shape of a grid.

18 Claims, 25 Drawing Sheets

(52) U.S. Cl.
CPC ............... *G09G 2300/0426* (2013.01); *G09G 2300/0819* (2013.01); *G09G 2300/0842* (2013.01); *G09G 2320/0233* (2013.01); *G09G 2330/021* (2013.01)

(58) Field of Classification Search
USPC .......................................................... 345/204
See application file for complete search history.

(56) References Cited

U.S. PATENT DOCUMENTS

| | | | | |
|---|---|---|---|---|
| 2022/0328603 | A1* | 10/2022 | Shi | H10K 59/80521 |
| 2022/0352291 | A1 | 11/2022 | Park et al. | |
| 2023/0015666 | A1* | 1/2023 | Chen | H10K 59/131 |
| 2023/0042966 | A1* | 2/2023 | Huangfu | G09G 3/3258 |
| 2023/0354642 | A1 | 11/2023 | Wang et al. | |
| 2024/0185780 | A1* | 6/2024 | Qing | G09G 3/3233 |

FOREIGN PATENT DOCUMENTS

| | | | |
|---|---|---|---|
| CN | 115050340 | A | 9/2022 |
| CN | 116884336 | A | 10/2023 |
| CN | 117766545 | A | 3/2024 |
| WO | 20220267001 | A1 | 12/2022 |

* cited by examiner

DISPLAY SUBSTRATE AND DISPLAY DEVICE

CROSS REFERENCE TO RELATED APPLICATION(S)

This application is a Section 371 National Stage Application of International Application No. PCT/CN2024/085993, filed on Apr. 3, 2024, entitled "DISPLAY SUBSTRATE AND DISPLAY DEVICE", not in English, which claims priority to International Application No. PCT/CN2024/085180 filed on Apr. 1, 2024, the contents of which are incorporated herein by reference in their entireties.

TECHNICAL FIELD

The present disclosure relates to a field of display technology, and in particular to a display substrate and a display device.

BACKGROUND

With the continuous development of display technology, organic light-emitting diode (OLED) display devices have become the research hotspot and technology development direction of major manufacturers due to their advantages, such as wide color gamut, high contrast ratio, thin and light design, self-luminescence, and wide viewing angle.

The above information disclosed in this section is only for understanding the background of the inventive concept of the present disclosure and therefore the above information may contain information that does not constitute the related art.

SUMMARY

In an aspect, a display substrate is provided, including: a base substrate; a plurality of sub-pixels on the base substrate, arranged in a first direction and/or a second direction, the first direction intersecting with the second direction, wherein the sub-pixel includes a light-emitting element and a driving circuit electrically connected to the light-emitting element; a first initialization signal transmission structure on the base substrate, electrically connected to the driving circuit and configured to provide a first initialization signal to the driving circuit; a second initialization signal transmission structure on the base substrate, electrically connected to the driving circuit and configured to provide a second initialization signal to the driving circuit; a reference voltage signal transmission structure on the base substrate, electrically connected to the driving circuit and configured to provide a reference voltage signal to the driving circuit; and a second power signal transmission structure on the base substrate, electrically connected to a second electrode of the light-emitting element and configured to provide a second power signal to the second electrode of the light-emitting element. An orthographic projection of at least one of the first initialization signal transmission structure, the second initialization signal transmission structure, the reference voltage signal transmission structure or the second power signal transmission structure on the base substrate is in a shape of a grid.

According to some exemplary embodiments, the display substrate includes a first conductive layer on the base substrate and a second conductive layer between the first conductive layer and the base substrate. The first initialization signal transmission structure includes a plurality of first initialization signal lines in the second conductive layer and a plurality of first initialization grid lines in the first conductive layer, the plurality of first initialization signal lines extend in the first direction and are arranged in the second direction, the plurality of first initialization grid lines extend in the second direction and are arranged in the first direction, and the first initialization grid line is electrically connected to at least one first initialization signal line; and/or the second initialization signal transmission structure includes a plurality of second initialization signal lines in the second conductive layer and a plurality of second initialization grid lines in the first conductive layer, the plurality of second initialization signal lines extend in the first direction and are arranged in the second direction, the plurality of second initialization grid lines extend in the second direction and are arranged in the first direction, and the second initialization grid line is electrically connected to at least one second initialization signal line; and/or the reference voltage signal transmission structure includes a plurality of reference voltage signal lines in the second conductive layer and a plurality of reference voltage grid lines in the first conductive layer, the plurality of reference voltage signal lines extend in the first direction and are arranged in the second direction, the plurality of reference voltage grid lines extend in the second direction and are arranged in the first direction, and the reference voltage grid line is electrically connected to at least one reference voltage signal line; and/or the second power signal transmission structure includes a plurality of second power signal lines in the first conductive layer and a plurality of second power grid lines in the second conductive layer, the plurality of second power signal lines extend in the second direction and are arranged in the first direction, the plurality of second power grid lines extend in the first direction and are arranged in the second direction, and the second power grid line is electrically connected to at least one second power signal line.

According to some exemplary embodiments, the first conductive layer includes a plurality of first wiring sets arranged in the first direction, the first wiring set includes three second power signal lines and three grid lines, the three second power signal lines and the three grid lines are alternately arranged in the first direction, and the three grid lines include one first initialization grid line, one second initialization grid line, and one reference voltage grid line.

According to some exemplary embodiments, the first wiring set includes three first wiring sub-sets arranged in the first direction, and the first wiring sub-set includes one second power signal line and one grid line; and the first wiring sub-set further includes one first power signal line and one data line, and the first power signal line and the data line are arranged on a side of the grid line and the second power signal line in the first direction.

According to some exemplary embodiments, the first conductive layer includes a plurality of first wiring sets arranged in the first direction, the first wiring set includes one second power signal line and three grid lines, and the three grid lines include one first initialization grid line, one second initialization grid line, and one reference voltage grid line. The second power signal line is arranged on a side of the three grid lines in the first direction, or the second power signal line is arranged between two of the three grid lines.

According to some exemplary embodiments, the first wiring set includes three first wiring sub-sets arranged in the first direction, each of two of the three first wiring sub-sets includes one grid line, and a remaining one of the three first wiring sub-sets includes one grid line and one second power signal line. The first wiring sub-set further includes one first power signal line and one data line, and the first power signal line and the data line are arranged on a side of the grid line in the first direction; or the first power signal line and the data line are arranged on a side of the grid line and the second power signal line in the first direction.

According to some exemplary embodiments, the second conductive layer includes a plurality of second wiring sets arranged in the second direction, and the second wiring set includes one first initialization signal line, one second initialization signal line, one reference voltage signal line and one second power grid line that are arranged in the second direction.

According to some exemplary embodiments, the display substrate further includes a first power signal transmission structure on the base substrate, wherein the first power signal transmission structure is electrically connected to the driving circuit and is configured to provide a first power signal to the driving circuit, and an orthographic projection of the first power signal transmission structure on the base substrate is in a shape of a grid.

According to some exemplary embodiments, the display substrate further includes a first conductive layer on the base substrate, a second conductive layer between the first conductive layer and the base substrate, and a third conductive layer between the second conductive layer and the base substrate. The first power signal transmission structure includes a plurality of first power signal lines in the first conductive layer, a plurality of first power signal connection portions in the second conductive layer and a plurality of first power grid lines in the third conductive layer, the plurality of first power signal lines are arranged in the first direction and extend in the second direction, and the plurality of first power grid lines are arranged in the second direction and extend in the first direction; and the first power grid line is electrically connected to at least one first power signal line through at least one first power signal connection portion, and the first power signal connection portion is electrically connected to the driving circuit and is used to provide the first power signal to the driving circuit.

According to some exemplary embodiments, an orthographic projection of the first power signal connection portion on the base substrate falls within an orthographic projection of the first power signal line on the base substrate.

According to some exemplary embodiments, the driving circuit includes a first transistor, a second transistor, a third transistor and a first storage capacitor. A first electrode of the first transistor is configured to receive a data signal, and a second electrode of the first transistor is electrically connected to a second electrode plate of the first storage capacitor; a first electrode of the second transistor is electrically connected to a second electrode of the third transistor, and a second electrode of the second transistor is electrically connected to a gate of the third transistor; and a first electrode of the third transistor is configured to receive a first power signal, and the gate of the third transistor is electrically connected to a first electrode plate of the first storage capacitor, where each of a gate of the first transistor and a gate of the second transistor is configured to receive a scanning signal.

According to some exemplary embodiments, the display substrate further includes a second conductive layer on the base substrate, and a fourth conductive layer between the second conductive layer and the base substrate, where the gate of the first transistor and the gate of the second transistor are arranged in the fourth conductive layer. The display substrate further includes a scanning signal line in the second conductive layer, the scanning signal line is electrically connected to each of the gate of the first transistor and the gate of the second transistor, and the scanning signal line is configured to provide the scanning signal to each of the gate of the first transistor and the gate of the second transistor.

According to some exemplary embodiments, the driving circuit further includes a fourth transistor, a fifth transistor, and an eighth transistor. A first electrode of the fourth transistor is configured to receive the first initialization signal, and a second electrode of the fourth transistor is electrically connected to the gate of the third transistor; a first electrode of the fifth transistor is configured to receive the reference voltage signal, and a second electrode of the fifth transistor is electrically connected to the second electrode of the first transistor; a first electrode of the eighth transistor is configured to receive the second initialization signal, and a second electrode of the eighth transistor is electrically connected to a first electrode of the light-emitting element, where each of a gate of the fourth transistor, a gate of the fifth transistor and a gate of the eighth transistor is configured to receive a reset signal.

According to some exemplary embodiments, the display substrate further includes a second conductive layer on the base substrate and a fourth conductive layer between the second conductive layer and the base substrate, wherein the gate of the fourth transistor, the gate of the fifth transistor and the gate of the eighth transistor are arranged in the fourth conductive layer. The display substrate further includes a reset signal line in the second conductive layer, the reset signal line is electrically connected to each of the gate of the fourth transistor, the gate of the fifth transistor and the gate of the eighth transistor, and the reset signal line is configured to provide the reset signal to each of the gate of the fourth transistor, the gate of the fifth transistor and the gate of the eighth transistor.

According to some exemplary embodiments, the plurality of sub-pixels include a first sub-pixel, a second sub-pixel and a third sub-pixel, the first sub-pixel includes a first driving circuit and a first light-emitting element electrically connected to the first driving circuit, the second sub-pixel includes a second driving circuit and a second light-emitting element electrically connected to the second driving circuit, and the third sub-pixel includes a third driving circuit and a third light-emitting element electrically connected to the third driving circuit. An active portion of the third transistor includes a channel portion, a first electrode and a second electrode, the first electrode and the second electrode of the active portion are respectively connected to the channel portion on opposite sides of the channel portion in the first direction. The third transistor in the first driving circuit includes a first channel portion, the third transistor in the second driving circuit includes a second channel portion, and the third transistor in the third driving circuit includes a third channel portion. A ratio of a size of the first channel portion in the first direction to a size of the first channel portion in the second direction is different from a ratio of a size of the second channel portion in the first direction to a size of the second channel portion in the second direction; and/or the ratio of the size of the first channel portion in the first direction to the size of the first channel portion in the second direction is different from a ratio of a size of the third channel portion in the first direction to a size of the third channel portion in the second direction; and/or the ratio of the size of the second channel portion in the first direction to the size of the second channel portion in the second direction is different from the ratio of the size of the third channel portion in the first direction to the size of the third channel portion in the second direction.

According to some exemplary embodiments, the first light-emitting element emits red light, the second light-emitting element emits green light, and the third light-emitting element emits blue light. The ratio of the size of the third channel portion in the first direction to the size of the third channel portion in the second direction is greater than the ratio of the size of the first channel portion in the first direction to the size of the first channel portion in the second direction; and/or wherein the ratio of the size of the third channel portion in the first direction to the size of the third channel portion in the second direction is greater than the ratio of the size of the second channel portion in the first direction to the size of the second channel portion in the second direction.

According to some exemplary embodiments, the size of the third channel portion in the first direction is equal to the size of the first channel portion in the first direction, and the size of the third channel portion in the second direction is less than the size of the first channel portion in the second direction; and/or the size of the third channel portion in the first direction is equal to the size of the second channel portion in the first direction, and the size of the third channel portion in the second direction is less than the size of the second channel portion in the second direction.

According to some exemplary embodiments, the display substrate further includes a second conductive layer on the base substrate, an insulation layer on a side of the second conductive layer away from the base substrate, a first conductive layer on a side of the insulation layer away from the base substrate, and a first electrode layer on a side of the first conductive layer away from the base substrate. The first electrode layer includes a plurality of first electrodes, the first electrode includes a first electrode main body portion and a first electrode connection portion connected to the first electrode main body portion; the first conductive layer includes a plurality of first transfer portions, the second conductive layer includes a plurality of second transfer portions, and the insulation layer includes a plurality of via holes, each of the plurality of via holes exposes at least part of a respective one of the plurality of second transfer portions; and the first electrode connection portion is electrically connected to the first transfer portion, the first transfer portion is electrically connected to the second transfer portion through the via hole, and the second transfer portion is electrically connected to the driving circuit, wherein orthographic projections of the plurality of first electrode main body portions on the base substrate cover at least part of orthographic projections of the plurality of via holes on the base substrate; and/or wherein the orthographic projections of the plurality of first electrode main body portions on the base substrate cover at least part of orthographic projections of the plurality of first transfer portions on the base substrate; and/or wherein the orthographic projections of the plurality of first electrode main body portions on the base substrate cover at least part of orthographic projections of the plurality of second transfer portions on the base substrate.

According to some exemplary embodiments, the plurality of first electrodes include a plurality of first sub-electrodes, a plurality of second sub-electrodes and a plurality of third sub-electrodes, and the plurality of first transfer portions include a plurality of first transfer sub-portions, a plurality of second transfer sub-portions and a plurality of third transfer sub-portions. The first sub-electrode and the third sub-electrode are spaced apart from each other in the second direction, and the second sub-electrode is arranged on a side of the first sub-electrode and the third sub-electrode in the first direction. The first sub-electrode includes a first sub-electrode main body portion and a first sub-electrode connection portion connected to an edge of the first sub-electrode main body portion facing the third sub-electrode, one end of the first transfer sub-portion is electrically connected to the first sub-electrode connection portion, and the other end of the first transfer sub-portion extends in the second direction and is electrically connected to the second transfer portion. The second sub-electrode includes a second sub-electrode main body portion and a second sub-electrode connection portion connected to an edge of the second sub-electrode main body portion facing the first sub-electrode and the third sub-electrode, one end of the second transfer sub-portion is electrically connected to the second sub-electrode connection portion, and the other end of the second transfer sub-portion extends in the second direction and is electrically connected to the second transfer portion. The third sub-electrode includes a third sub-electrode main body portion and a third sub-electrode connection portion connected to a corner portion of the third sub-electrode main body portion, the corner portion of the third sub-electrode main body portion is on a side of the third sub-electrode main body portion away from the first sub-electrode and facing the second sub-electrode, the third sub-electrode connection portion extends in the first direction and is electrically connected to one end of the third transfer sub-portion, and the other end of the third transfer sub-portion extends in the second direction and is electrically connected to the second transfer portion. An orthographic projection of the second transfer portion electrically connected to the first transfer sub-portion on the base substrate falls within an orthographic projection of the third sub-electrode main body portion on the base substrate; and an orthographic projection of the second transfer portion electrically connected to the third transfer sub-portion on the base substrate falls within an orthographic projection of the second sub-electrode main body portion on the base substrate.

In another aspect, a display device is provided, including any display substrate described above.

BRIEF DESCRIPTION OF THE DRAWINGS

Features and advantages of the present disclosure will become more clear by describing exemplary embodiments of the present disclosure in detail with reference to the accompanying drawings.

FIG. 5B schematically shows a fourth conductive layer; FIG. 5C schematically shows a second insulation layer; and FIG. 5D schematically shows a second conductive layer.

FIG. 7A to FIG. 7G are plan views of some layers of a display substrate arranged in a display region according to some exemplary embodiments of the present disclosure, wherein FIG. 7A shows a plan view of a combination of a second conductive layer, a first conductive layer and a first electrode layer; FIG. 7B shows a first electrode layer; FIG. 7C shows a second planarization layer; FIG. 7D shows a first conductive layer; FIG. 7E shows a first planarization layer; FIG. 7F shows a passivation layer; FIG. 7G shows a second conductive layer.

FIG. 8A to FIG. 8H are plan views of some layers of a display substrate arranged in a display region according to some exemplary embodiments of the present disclosure, wherein FIG. 8A shows an active layer; FIG. 8B shows a first gate metal layer; FIG. 8C shows a second gate metal layer; FIG. 8D shows an interlayer insulation layer; FIG. 8E shows a first source and drain metal layer; FIG. 8F shows a passivation layer; FIG. 8G shows a first planarization layer; and FIG. 8H shows a second source and drain metal layer.

DETAILED DESCRIPTION OF EMBODIMENTS

Figure 1:
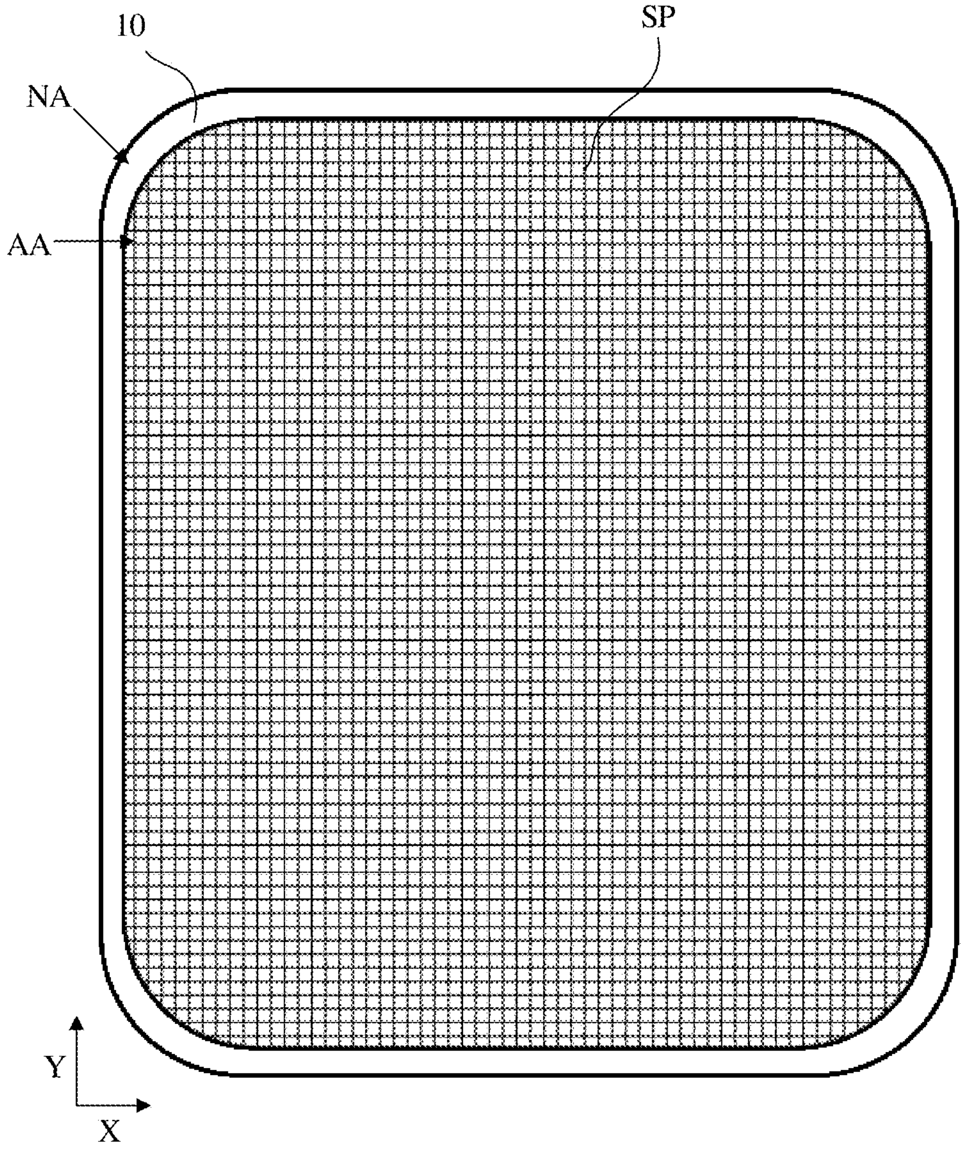
FIG. 1 is a plan view of a display substrate according to some embodiments of the present disclosure.

In order to make the purpose, technical solutions and advantages of embodiments of the present disclosure more clear, the technical solutions in embodiments of the present disclosure will be clearly and completely described below in conjunction with the accompanying drawings. Clearly, the described embodiments are only part of embodiments of the present disclosure, rather than all embodiments. Based on the described embodiments of the present disclosure, all other embodiments obtained by those of ordinary skill in the art without inventive efforts fall within the protection of scope of the present disclosure.

It will be noted that in the drawings, size(s) and relative size(s) of element(s) may be exaggerated for clarity and/or description. As such, sizes and relative sizes of the various elements are not necessarily limited to the sizes and relative sizes shown in the drawings. In the specification and the drawings, the same or similar reference numerals indicate the same or similar parts.

When an element is described as being "on", "connected to", or "coupled to" another element, the element may be directly on, directly connected to, or directly coupled to the other element, or there may be an intervening element. However, when an element is described as being "directly on", "directly connected to", or "directly coupled to" another element, there are no intervening element. Other terms and/or expressions used to describe the relationship between elements should be interpreted in a similar manner, for example, "between" versus "directly between", "adjacent" versus "directly adjacent", or "on" versus "directly on", etc. In addition, the term "connection" may refer to a physical connection, an electrical connection, a communication connection, and/or a fluid connection. In addition, the X-axis, Y-axis, and Z-axis are not limited to the three axes of a rectangular coordinate system and they may be interpreted in a broader sense. For example, the X-axis, Y-axis, and Z-axis may be perpendicular to each other, or may represent different directions that are not perpendicular to each other. According to the present disclosure, "at least one of X, Y, or Z" and "at least one selected from a group consisting of X, Y, and Z" may be interpreted as only X, only Y, only Z, or any combination of two or more of X, Y, and Z, such as XYZ, XY, YZ, and XZ. As used herein, the term "and/or" includes any and all combinations of one or more of the listed related items.

It will be noted that the terms "first", "second", etc. may be used herein to describe various components, members, elements, regions, layers and/or portions, however, these components, members, elements, areas, layers and/or portions should not be limited by these terms. Rather, these terms are used to distinguish one component, member, element, area, layer and/or portion from another one. Accordingly, for example, a first component, a first member, a first element, a first region, a first layer and/or a first portion discussed below could be termed a second component, a second member, a second element, a second region, a second layer and/or a second portion without departing from the teachings of the present disclosure.

For ease of description, spatially relative terms, such as "upper," "lower," "left," "right," etc. may be used herein to describe the relationship of one element or feature to another element or feature as shown in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above"or "over"the other elements or features.

In the present disclosure, the terms "substantially", "about", "approximately", "roughly" and other similar terms are used as terms of approximation rather than terms of degree, and they are intended to account for the inherent variations in measurements or calculations that would be recognized by those of ordinary skill in the art. As used herein, "about" or "approximately" are inclusive of the stated value and indicate that the particular value is within an acceptable range of deviation as determined by one of ordinary skill in the art to take into account factors such as process variations, measurement problems, and errors associated with the measurement of a particular quantity (i.e., limitations of the measurement system). For example, "about" may mean within one or more standard deviations, or within ±30%, ±20%, ±10%, ±5% of the stated value.

It will be noted that, in the present disclosure, "the same layer" refers to a layer structure formed by using the same film formation process to form a film for forming a specific pattern, and then patterning the film through a single patterning process with the same mask. Depending on the specific pattern, a single patterning process may include a plurality of exposure, development or etching processes, and the specific pattern in the formed layer structure may be continuous or discontinuous. That is, a plurality of elements, components, structures and/or portions located in the "same layer" are made of the same material and formed through the same patterning process. Generally, the plurality of elements, components, structures and/or portions located in the "same layer"have approximately the same thickness.

Those skilled in the art will understand that, in the present disclosure, unless otherwise specified, the expression "height" or "thickness" refers to a size of a surface of each layer perpendicular to the display substrate, that is, a size along the light-emitting direction of a display substrate, or a size along the normal direction of the display device.

In the present disclosure, the term "transistor" may refer to a triode, a thin film transistor, a field effect transistor or other elements having the same characteristics. In embodiments of the present disclosure, in order to distinguish the two electrodes of a transistor other than the control electrode of the transistor, one of the two electrodes is called a first electrode and the other is called a second electrode. In actual operation, when the transistor is a thin film transistor or a field effect transistor, the first electrode thereof may be a drain, and the second electrode may be a source; or, the first electrode may be a source, and the second electrode may be a drain.

FIG. 1 schematically shows a plan view of a display substrate according to some embodiments of the present disclosure.

According to some exemplary embodiments, referring to FIG. 1, a display substrate includes a display region AA and a peripheral region NA around the display region AA. The display substrate includes a base substrate 10 and a plurality of sub-pixels SP on the base substrate 10. The plurality of sub-pixels SP are arranged in the display region AA in a first direction X and a second direction Y. The first direction X intersects with the second direction Y. For example, the first direction X is perpendicular to the second direction Y. Each sub-pixel SP includes a light-emitting element and a driving circuit electrically connected to the light-emitting element, and the driving circuit is used to separately drive the light-emitting element to emit light, so as to enable the display substrate to display an image.

For example, the light-emitting element used in embodiments of the present disclosure may be an organic light-emitting diode (OLED). For example, the light-emitting element may be an OLED with a top emission structure, which may emit red light, green light, blue light, white light, or the like. Embodiments of the present disclosure do not limit the specific structure of the light-emitting element. For example, a first electrode of the light-emitting element is an anode of the OLED, and a second electrode of the light-emitting element is a cathode of the OLED, that is, the pixel circuits have a common cathode. However, embodiments of the present disclosure do not limit this. Based on changes in the circuit structure, the pixel circuits may have a common anode.

The display substrate used in embodiments of the present disclosure may be a rigid substrate, such as a glass substrate, a silicon substrate, etc., or may be made of a flexible material with excellent heat resistance and durability, such as polyimide (PI), polycarbonate (PC), polyethylene terephthalate (PET), polyethylene, polyacrylate, polyarylate, polyetherimide, polyethersulfone, polyethylene glycol terephthalate (PET), polyethylene (PE), polypropylene (PP), polysulfone (PSF), polymethyl methacrylate (PMMA), triacetyl cellulose (TAC), cycloolefin polymer (COP), cycloolefin copolymer (COC), etc.

According to some exemplary embodiments, the display substrate includes a driving circuit layer on the base substrate and a light-emitting element layer on a side of the driving circuit layer away from the base substrate, the driving circuits are arranged in the driving circuit layer, and the light-emitting elements are arranged in the light-emitting element layer.

For example, the driving circuit layer includes a first conductive layer on the base substrate, a second conductive layer between the first conductive layer and the base substrate, a third conductive layer between the second conductive layer and the base substrate, a fourth conductive layer between the third conductive layer and the base substrate, and an active layer between the fourth conductive layer and the base substrate.

For example, the light-emitting element layer includes a first electrode layer on a side of the driving circuit layer away from the base substrate, a pixel defining layer on a side of the first electrode layer away from the base substrate, a light-emitting function layer on a side of the pixel defining layer away from the base substrate, and a second electrode layer on a side of the light-emitting function layer away from the base substrate.

Figure 2:
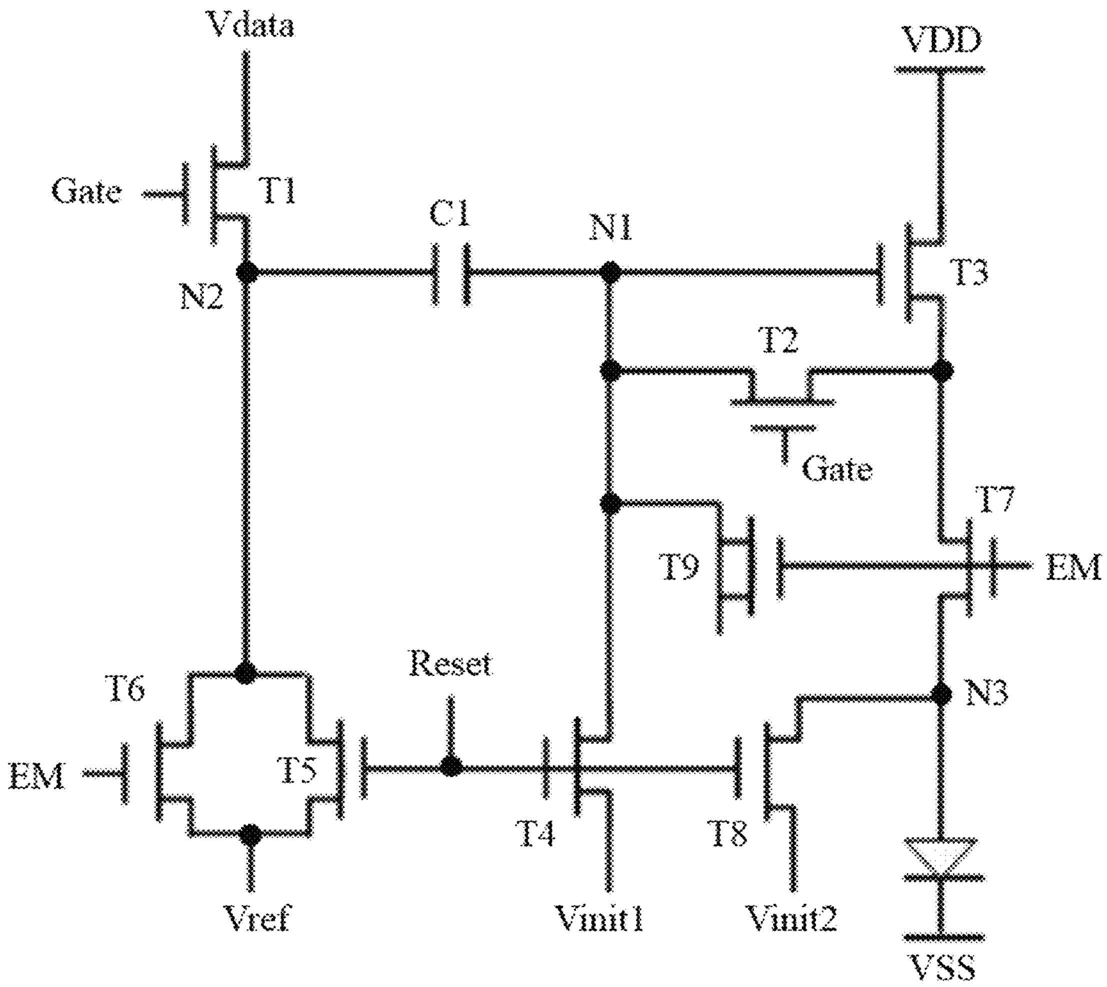
FIG. 2 schematically shows a schematic circuit diagram of a driving circuit in a display substrate according to some embodiments of the present disclosure.
Figure 3:
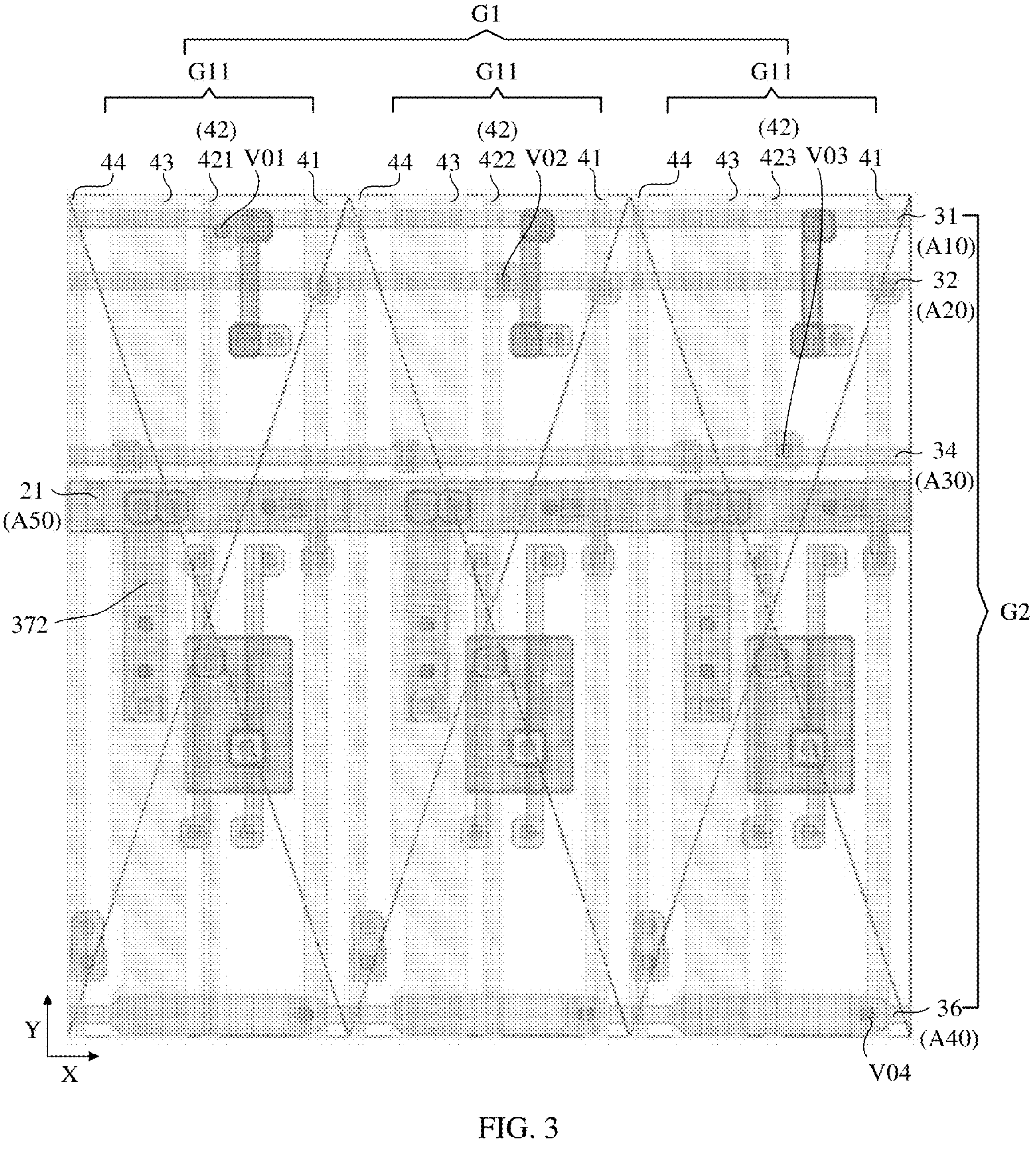
FIG. 3 schematically shows a plan view of a combination of a third conductive layer, a second conductive layer and a first conductive layer in a display substrate according to some embodiments of the present disclosure.

FIG. 2 schematically shows a schematic circuit diagram of a driving circuit in a display substrate according to some embodiments of the present disclosure. FIG. 3 schematically shows a plan view of a combination of a third conductive layer, a second conductive layer and a first conductive layer in a display substrate according to some embodiments of the present disclosure.

It is additionally stated that in the plan views of some film layers of the display substrate provided in embodiments of the present disclosure, a rectangular block and cross lines within the rectangular block are only for illustrating an arrangement range of a driving circuit, and they are not part of the layer structure in the display substrate.

Referring to FIG. 3, the display substrate includes a first initialization signal transmission structure A10, a second initialization signal transmission structure A20, a reference voltage signal transmission structure A30 and a second power signal transmission structure A40 arranged on the base substrate. For example, the first initialization signal transmission structure A10, the second initialization signal transmission structure A20, the reference voltage signal transmission structure A30 and the second power signal transmission structure A40 are arranged in the driving circuit layer.

Referring to FIG. 2 and FIG. 3, the first initialization signal transmission structure A10 is electrically connected to the driving circuit and is used to provide a first initialization signal Vinit1 to the driving circuit. The second initialization signal transmission structure A20 is electrically connected to the driving circuit and is used to provide a second initialization signal Vinit2 to the driving circuit. The reference voltage signal transmission structure A30 is electrically connected to the driving circuit and is used to provide a reference voltage signal Vref to the driving circuit. The second power signal transmission structure A40 is electrically connected to a second electrode of the light-emitting element and is used to provide a second power signal VSS to the second electrode.

At least one of the first initialization signal transmission structure A10, the second initialization signal transmission structure A20, the reference voltage signal transmission structure A30 or the second power signal transmission structure A40 has a grid-like structure. For example, referring to FIG. 3, an orthographic projection of the first initialization signal transmission structure A10 on the base substrate is in a shape of a grid, an orthographic projection of the second initialization signal transmission structure A20 on the base substrate is in a shape of a grid, an orthographic projection of the reference voltage signal transmission structure A30 on the base substrate is in a shape of a grid, and an orthographic projection of the second power signal transmission structure A40 on the base substrate is in a shape of a grid. By providing grid-like first initialization signal transmission structure A10, second initialization signal transmission structure A20, reference voltage signal transmission structure A30 and second power signal transmission structure A40, the uniformity of distribution of the first initialization signal Vinit1, the second initialization signal Vinit2, the reference voltage signal Vref and the second power signal VSS in the display region is effectively improved, thereby improving the display uniformity of the display substrate.

According to some exemplary embodiments, with reference to FIG. 3, the first initialization signal transmission structure A10 includes a plurality of first initialization signal lines 31 in the second conductive layer and a plurality of first initialization grid lines 421 in the first conductive layer. The plurality of first initialization signal lines 31 extend in the first direction X and are arranged in the second direction Y. The plurality of first initialization grid lines 421 extend in the second direction Y and are arranged in the first direction X. The plurality of first initialization grid lines 421 extending in the second direction Y and the plurality of first initialization signal lines 31 extending in the first direction X are crisscrossed to form the grid-like first initialization signal transmission structure A10. The first initialization grid line 421 is electrically connected to at least one first initialization signal line 31. For example, a first insulation layer is arranged between the first conductive layer and the second conductive layer. The first insulation layer includes a plurality of first via holes V01, and the first initialization grid line 421 is electrically connected to the plurality of first initialization signal lines 31 through the plurality of first via holes V01.

According to some exemplary embodiments, with reference to FIG. 3, the second initialization signal transmission structure A20 includes a plurality of second initialization signal lines 32 in the second conductive layer and a plurality of second initialization grid lines 422 in the first conductive layer. The plurality of second initialization signal lines 32 extend in the first direction X and are arranged in the second direction Y. The plurality of second initialization grid lines 422 extend in the second direction Y and are arranged in the first direction X. The plurality of second initialization grid lines 422 extending in the second direction Y and the plurality of second initialization signal lines 32 extending in the first direction X are crisscrossed to form the grid-like second initialization signal transmission structure A20. The second initialization grid line 422 is electrically connected to at least one second initialization signal line 32. For example, the first insulation layer is arranged between the first conductive layer and the second conductive layer. The first insulation layer includes a plurality of second via holes V02, and the second initialization grid line 422 is electrically connected to the plurality of second initialization signal lines 32 through the plurality of second via holes V02.

According to some exemplary embodiments, with reference to FIG. 3, the reference voltage signal transmission structure A30 includes a plurality of reference voltage signal lines 34 in the second conductive layer and a plurality of reference voltage grid lines 423 in the first conductive layer. The plurality of reference voltage signal lines 34 extend in the first direction X and are arranged in the second direction Y. The plurality of reference voltage grid lines 423 extend in the second direction Y and are arranged in the first direction X. The plurality of reference voltage grid lines 423 extending in the second direction Y and the plurality of reference voltage signal lines 34 extending in the first direction X are crisscrossed to form the reference voltage signal transmission structure A30. The reference voltage grid line 423 is electrically connected to at least one reference voltage signal line 34. For example, the first insulation layer is arranged between the first conductive layer and the second conductive layer. The first insulation layer includes a plurality of third via holes V03, and the reference voltage grid line 423 is electrically connected to the plurality of reference voltage signal lines 34 through the plurality of third via holes V03.

According to some exemplary embodiments, with reference to FIG. 3, the second power signal transmission structure A40 includes a plurality of second power signal lines 41 in the first conductive layer and a plurality of second power grid lines 36 in the second conductive layer. The plurality of second power signal lines 41 extend in the second direction Y and are arranged in the first direction X. The plurality of second power grid lines 36 extend in the first direction X and are arranged in the second direction Y. The plurality of second power grid lines 36 extending in the first direction X and the plurality of second power signal lines 41 extending in the second direction Y are crisscrossed to form the grid-like second power signal transmission structure A40. The second power grid line 36 is electrically connected to at least one second power signal line 41. For example, the first insulation layer is arranged between the first conductive layer and the second conductive layer. The first insulation layer includes a plurality of fourth via holes V04, and the second power grid line 36 is electrically connected to the plurality of second power signal lines 41 through the plurality of fourth via holes V04.

According to some exemplary embodiments, referring to FIG. 3, the first conductive layer includes a plurality of first wiring sets G1 arranged in the first direction X, the first wiring set G1 includes three second power signal lines 41 and three grid lines 42, the three second power signal lines 41 and the three grid lines 42 are alternately arranged in the first direction X, and the three grid lines 42 include a first initialization grid line 421, a second initialization grid line 422 and a reference voltage grid line 423.

According to some exemplary embodiments, referring to FIG. 3, the first wiring set G1 includes three first wiring sub-sets G11 arranged in the first direction X, and the first wiring sub-set G11 includes a second power signal line 41 and a grid line 42. In addition, each first wiring sub-set G11 further includes a first power signal line 43 and a data line 44, which are arranged on a side of the grid line 42 and the second power signal line 41 in the first direction X. Referring to FIG. 2 and FIG. 3, the first power signal line 43 is electrically connected to the driving circuit and is used to provide a first power signal VDD to the driving circuit, and the data line 44 is electrically connected to the driving circuit and is used to provide a data signal Vdata to the driving circuit.

For example, referring to FIG. 3, the first wiring sub-set G11 includes four wires, which are sequentially a data line 44, a first power signal line 43, a grid line 42 and a second power signal line 41 in the first direction X.

For example, referring to FIG. 3, the first wiring set G1 includes twelve wires, which are sequentially a data line 44, a first power signal line 43, a first initialization grid line 421, a second power signal line 41, a data line 44, a first power signal line 43, a second initialization grid line 422, a second power signal line 41, a data line 44, a first power signal line 43, a reference voltage grid line 423 and the second power signal line 41 in the first direction X.

Figure 4:
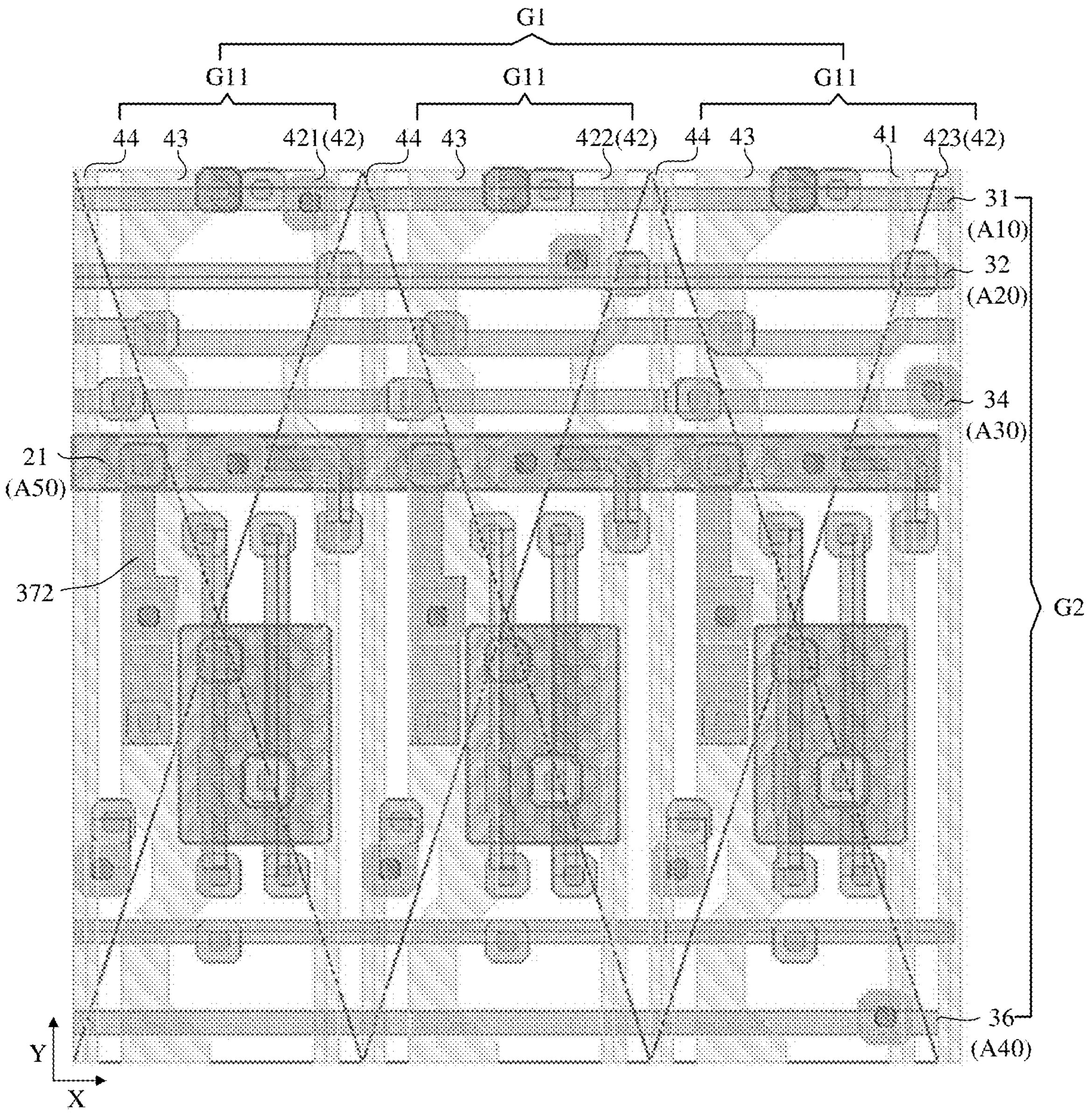
FIG. 4 schematically shows a plan view of a combination of a third conductive layer, a second conductive layer and a first conductive layer in a display substrate according to some embodiments of the present disclosure.

FIG. 4 schematically shows a plan view of a combination of a third conductive layer, a second conductive layer and a first conductive layer in a display substrate according to some embodiments of the present disclosure.

According to some exemplary embodiments, referring to FIG. 4, the first conductive layer includes a plurality of first wiring sets G1 arranged in the first direction X. The first wiring set G1 includes a second power signal line 41 and three grid lines 42. The three grid lines 42 include a first initialization grid line 421, a second initialization grid line 422 and a reference voltage grid line 423. The second power signal line 41 is arranged on a side of the three grid lines 42 in the first direction X, or the second power signal line 41 is arranged between two of the three grid lines 42. For example, the second power signal line 41 is arranged between the second initialization grid line 422 and the reference voltage grid line 423.

According to some exemplary embodiments, referring to FIG. 4, the first wiring set G1 includes three first wiring sub-sets G11 arranged in the first direction X, each of two first wiring sub-sets G11 among the three first wiring sub-sets G11 includes a grid line 42, and the remaining one of the three first wiring sub-sets G11 includes a grid line 42 and a second power signal line 41. The first wiring sub-set G11 further includes a first power signal line 43 and a data line 44, and the first power signal line 43 and the data line 44 are arranged on a side of the grid line 42 in the first direction X; or the first power signal line 43 and the data line 44 are arranged on a side of the grid line and the second power signal line 41 in the first direction X.

For example, referring to FIG. 4, the first wiring set G1 includes ten wires, which are sequentially a data line 44, a first power signal line 43, a first initialization grid line 421, a data line 44, a first power signal line 43, a second initialization grid line 422, a data line 44, a first power signal line 43, a second power signal line 41 and a reference voltage grid line 423 in the first direction X.

According to some exemplary embodiments, referring to FIG. 3 or FIG. 4, the second conductive layer includes a plurality of second wiring sets G2 arranged in the second direction Y. The second wiring set G2 includes a first initialization signal line 31, a second initialization signal line 32, a reference voltage signal line 34 and a second power grid line 36 arranged in the second direction Y.

According to some exemplary embodiments, referring to FIG. 3 or FIG. 4, the display substrate further includes a first power signal transmission structure A50 on the base substrate, and an orthographic projection of the first power signal transmission structure A50 on the base substrate is in a shape of a grid. Referring to FIG. 2, the first power signal transmission structure A50 is electrically connected to the driving circuit and is used to provide the first power signal VDD to the driving circuit. By providing the gird like first power signal transmission structure A50, the uniformity of distribution of the first power signal VDD in the display region is effectively improved, thereby improving the display uniformity of the display substrate.

According to some exemplary embodiments, referring to FIG. 3 or FIG. 4, the first power signal transmission structure A50 includes a plurality of first power signal lines 43 in the first conductive layer, a plurality of first power signal connection portions 372 in the second conductive layer, and a plurality of first power grid lines 21 in the third conductive layer. The plurality of first power signal lines 43 are arranged in the first direction X and extend in the second direction Y. The plurality of first power grid lines 21 are arranged in the second direction Y and extend in the first direction X. The plurality of first power signal lines 43 extending in the second direction Y and the plurality of first power grid lines 21 extending in the first direction X are crisscrossed to form the grid-like first power signal transmission structure A50. The first power grid line 21 is electrically connected to at least one first power signal line 43 through at least one first power signal connection portion 372, and the first power signal connection portion 372 is electrically connected to the driving circuit and is used to provide the first power signal to the driving circuit. For example, the first power grid line 21 is electrically connected to the plurality of first power signal lines 43 through the plurality of first power signal connection portions 372.

According to some exemplary embodiments, referring to FIG. 3 or FIG. 4, the first power signal connection portion 372 is in a shape of a strip extending in the second direction Y, and an orthographic projection of the first power signal connection portion 372 on the base substrate falls within an orthographic projection of the first power signal line 43 on the base substrate.

FIG. 5A to FIG. 5D are plan views of some layers of a display substrate arranged in a display region according to some exemplary embodiments of the present disclosure.

Figure 5A:
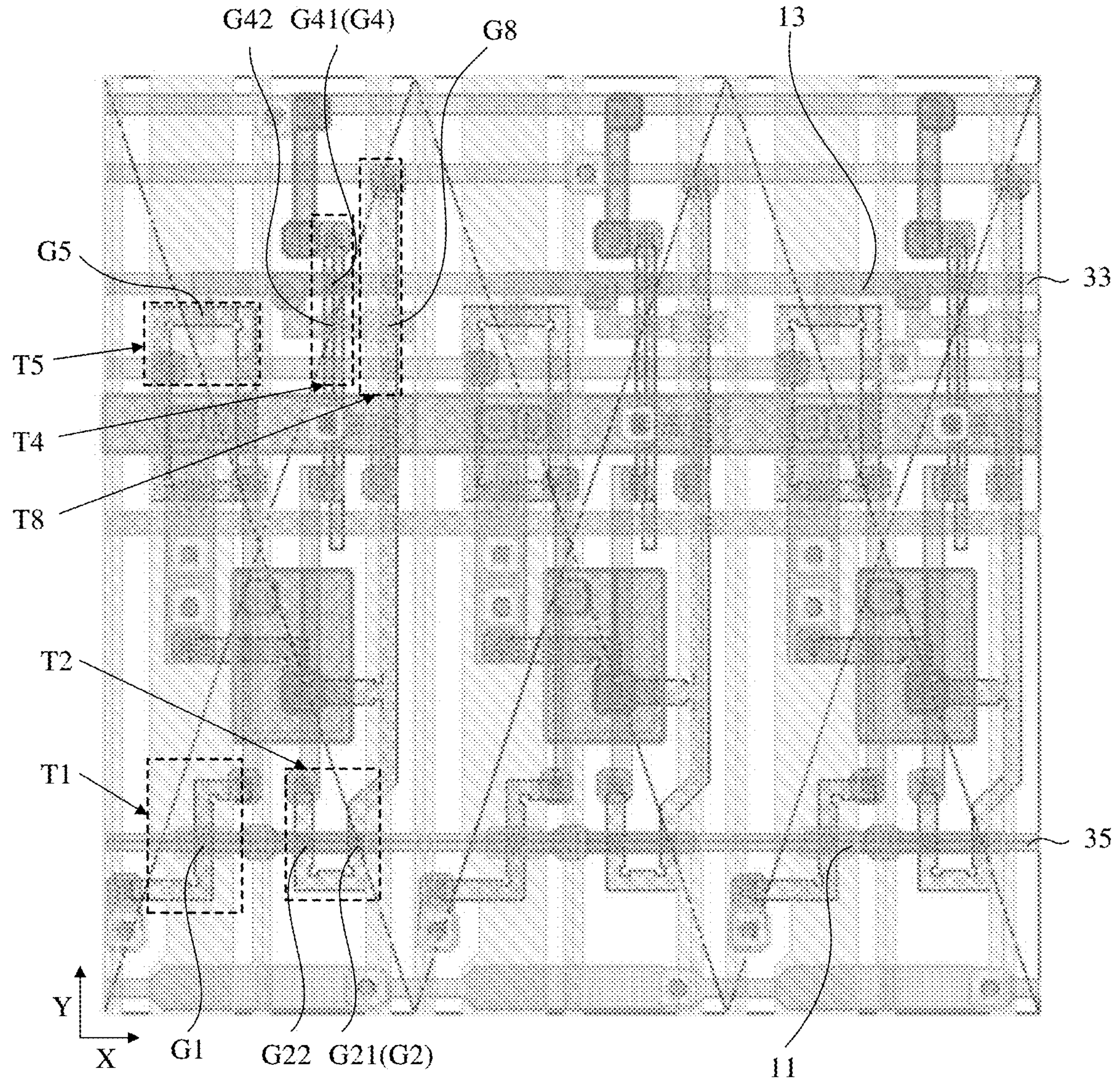
FIG. 5A to FIG. 5D are plan views of some layers of a display substrate arranged in a display region according to some exemplary embodiments of the present disclosure, wherein FIG. 5A schematically shows a plan view of a combination of an active layer, a fourth conductive layer, a third conductive layer, a second conductive layer and a first conductive layer.
Figure 5B:
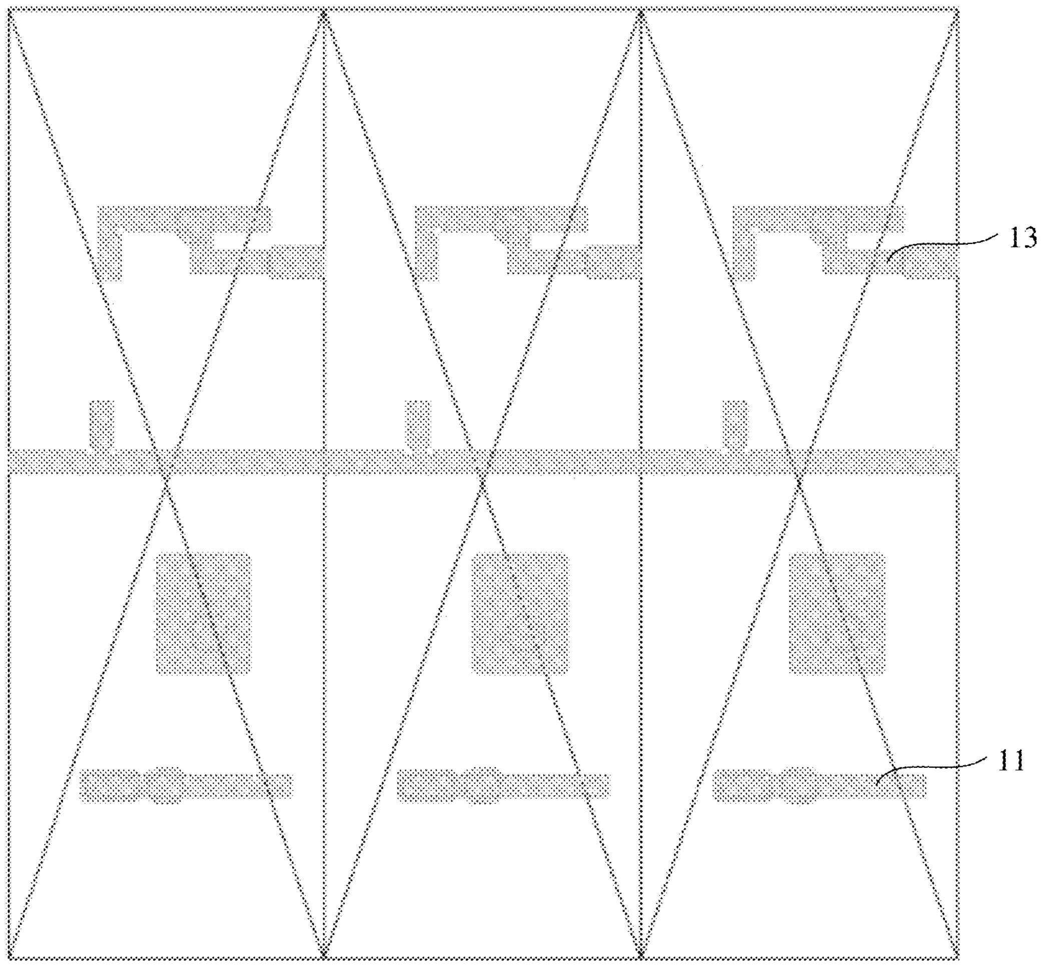
Figure 5C:
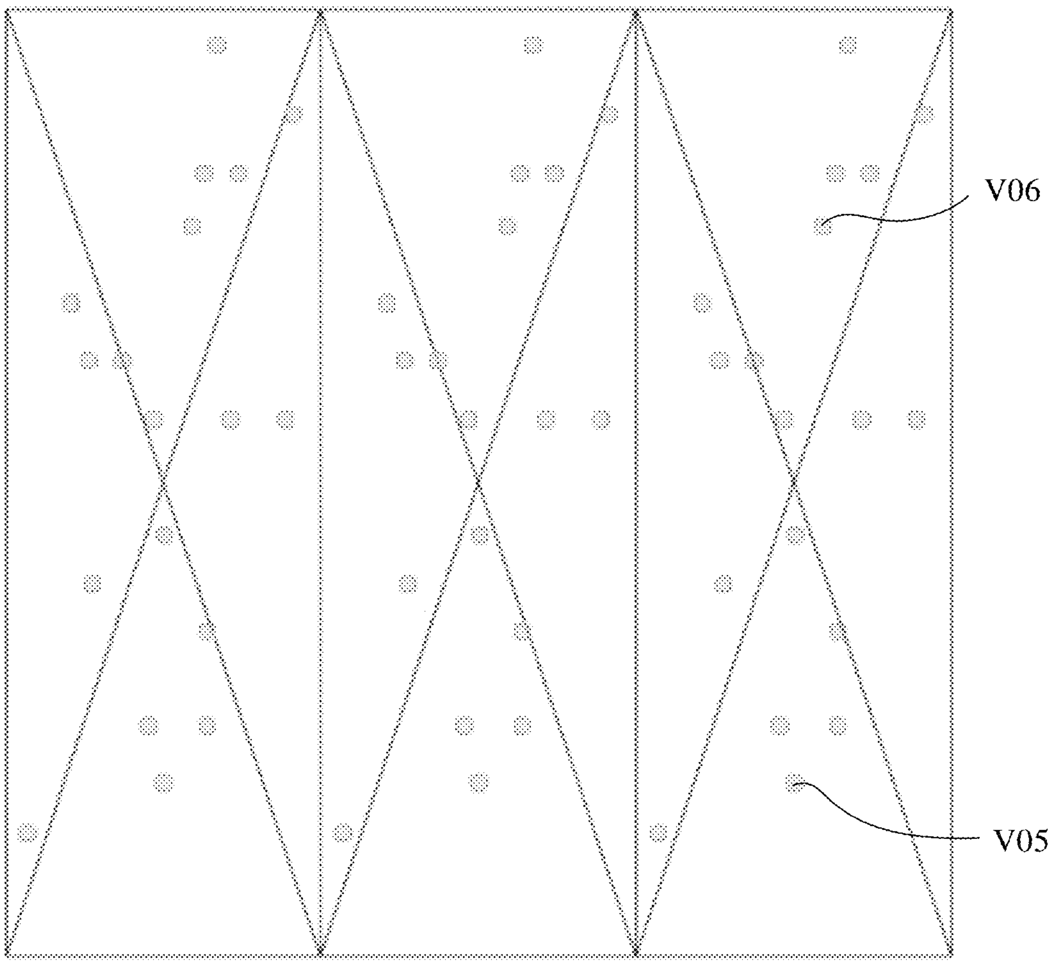
Figure 5D:
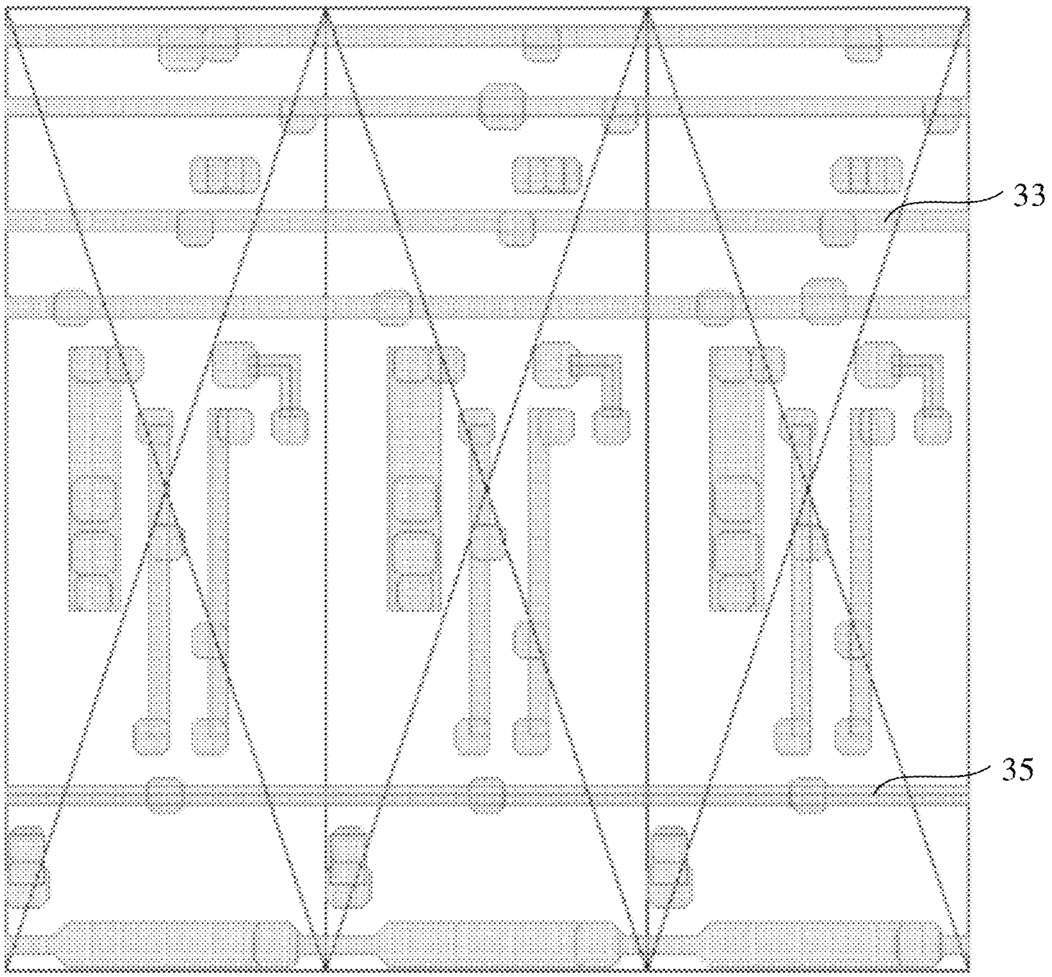

FIG. 5A schematically shows a plan view of a combination of an active layer, a fourth conductive layer, a third conductive layer, a second conductive layer and a first conductive layer. FIG. 5B schematically shows a fourth conductive layer. FIG. 5C schematically shows a second insulation layer. FIG. 5D schematically shows a second conductive layer.

According to some exemplary embodiments, referring to FIG. 2, the driving circuit includes a first transistor T1, a second transistor T2, a third transistor T3, and a first storage capacitor C1. A first electrode of the first transistor T1 is used to receive the data signal Vdata, and a second electrode of the first transistor T1 is electrically connected to a second electrode plate of the first storage capacitor C1. A first electrode of the second transistor T2 is electrically connected to a second electrode of the third transistor T3, and a second electrode of the second transistor T2 is electrically connected to a gate of the third transistor T3. A first electrode of the third transistor T3 is used to receive the first power signal VDD, and the gate of the third transistor T3 is electrically connected to a first electrode plate of the first storage capacitor C1. Each of a gate of the first transistor T1 and a gate of the second transistor T2 is used to receive a scanning signal Gate.

According to some exemplary embodiments, referring to FIG. 5A, an active portion of the first transistor T1 and an active portion of the second transistor T2 are in an active layer, the gate G1 of the first transistor T1 and the gate G2 of the second transistor T2 are in a fourth conductive layer. The fourth conductive layer includes a first conductive portion 11, and the first conductive portion 11 includes the gate G1 of the first transistor T1 and the gate G2 of the second transistor T2. That is, the gate G1 of the first transistor T1 and the gate G2 of the second transistor T2 are connected to form an integral structure. The display substrate further includes a scanning signal line 35 in the second conductive layer. The scanning signal line 35 extends in the first direction X and is electrically connected to the first conductive portion 11. That is, the scanning signal line 35 is electrically connected to the gate G1 of the first transistor T1 and the gate G2 of the second transistor T2. The scanning signal line 35 is used to provide the scanning signal to the gate G1 of the first transistor T1 and the gate G2 of the second transistor T2. A sheet resistance of the fourth conductive layer is greater than a sheet resistance of the second conductive layer. For example, the fourth conductive layer is a single layer formed of metal molybdenum, and the second conductive layer is a stack formed of titanium layer/aluminum layer/titanium layer. Based on the above arrangement, it is possible to effectively reduce the wiring resistance of the scanning signal line 35 used to transmit the scanning signal, so that the voltage drop (IR Drop) in the transmission of the scanning signal may be reduced and the uniformity of distribution of the scanning signal may be improved, thereby improving the display uniformity of the display substrate.

The term "integral structure" used in embodiments of the present disclosure refers to a structure in which two (or more) structures are formed through the same film formation process and patterned through the same patterning process to be connected to each other, and they may be made of the same material or different materials.

According to some exemplary embodiments, referring to FIG. 5A, the second transistor T2 is a dual-gate transistor, and the gate of the second transistor T2 includes a first gate G21 and a second gate G22.

According to some exemplary embodiments, referring to FIG. 5B to FIG. 5D, a second insulation layer is arranged between the fourth conductive layer and the second conductive layer. The second insulation layer includes a plurality of fifth via holes V05, the fifth via hole V05 exposes at least part of the first conductive portion 11, and the scanning signal line 35 is electrically connected to the plurality of first conductive portions 11 through the plurality of fifth via holes V05.

According to some exemplary embodiments, referring to FIG. 2, the driving circuit further includes a fourth transistor T4, a fifth transistor T5 and an eighth transistor T8. A first electrode S4 of the fourth transistor T4 is used to receive the first initialization signal Vinit1, and a second electrode D4 of the fourth transistor T4 is electrically connected to the gate of the third transistor T3. A first electrode S5 of the fifth transistor T5 is used to receive to the reference voltage signal Vref, and a second electrode D5 of the fifth transistor T5 is electrically connected to the second electrode D1 of the first transistor T1. A first electrode S8 of the eighth transistor T8 is used to receive the second initialization signal Vinit2, and a second electrode D8 of the eighth transistor T8 is electrically connected to the first electrode of the light-emitting element. Each of a gate of the fourth transistor T4, a gate of the fifth transistor T5 and a gate of the eighth transistor T8 is used to receive a reset signal Reset.

Figure 8A:
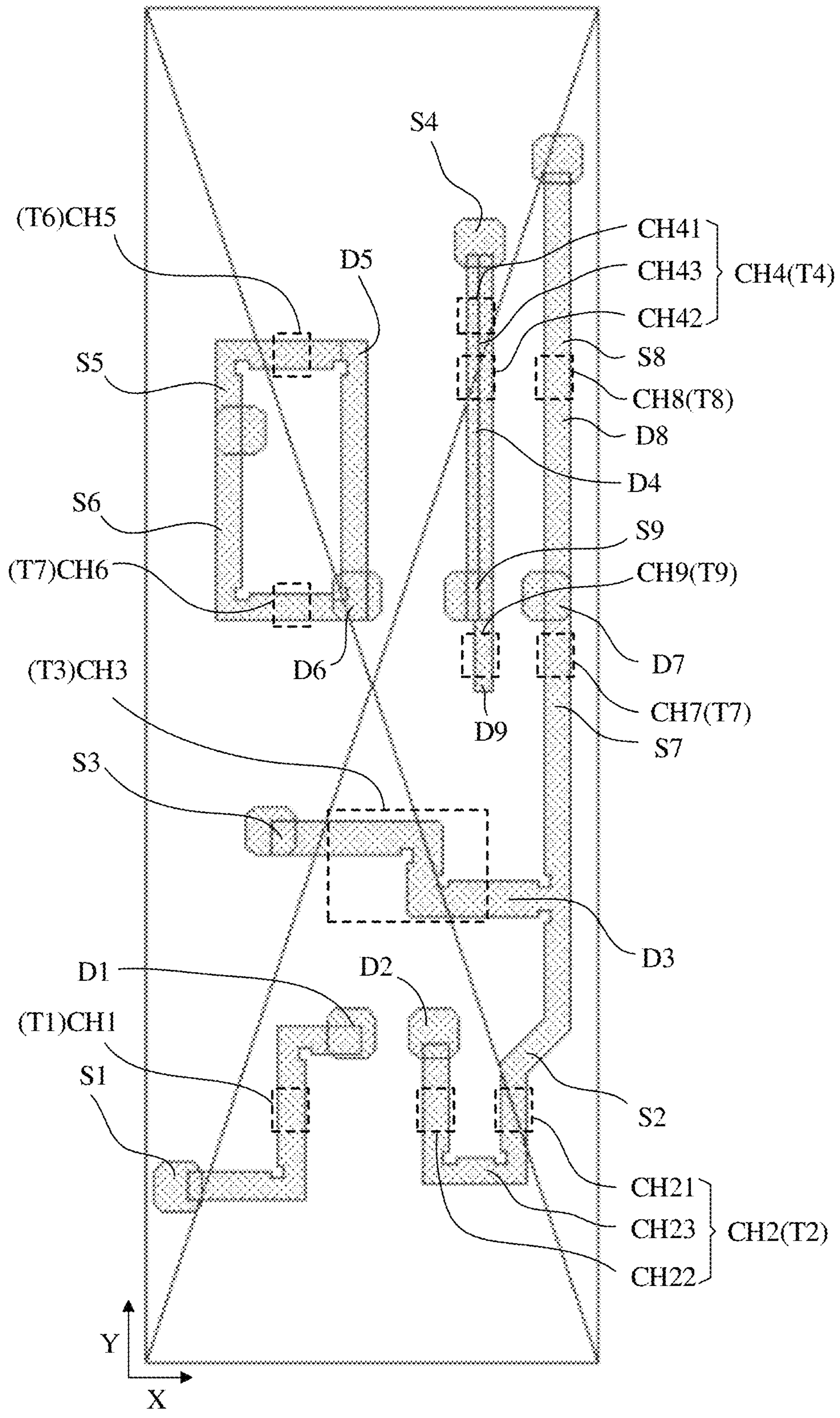
Figure 8B:
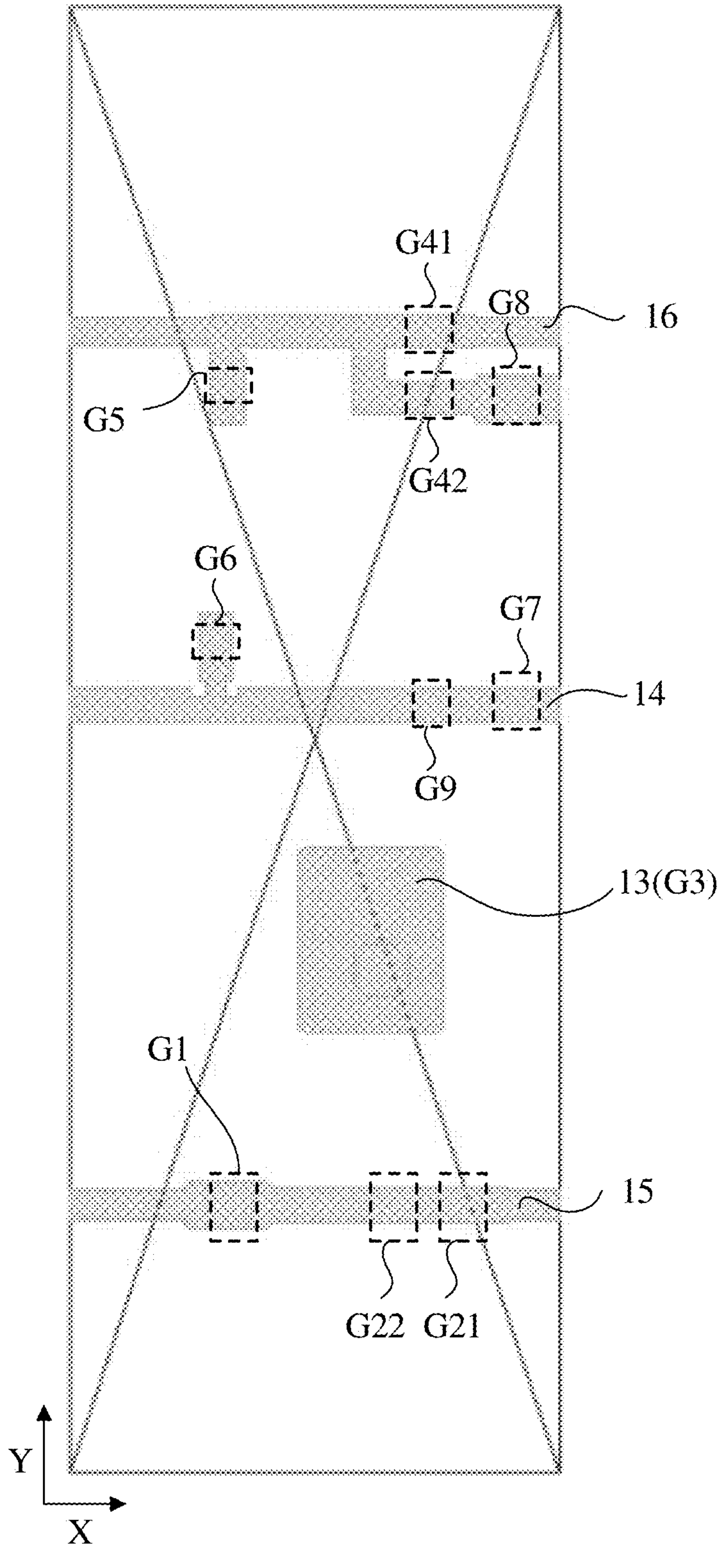

According to some exemplary embodiments, referring to FIG. 5A and FIG. 8A, an active portion of the fourth transistor T4, an active portion of the fifth transistor T5 and an active portion of the eighth transistor T8 are in the active layer, and the gate G4 of the fourth transistor T4, the gate G5 of the fifth transistor T5 and the gate G8 of the eighth transistor T8 are in the fourth conductive layer. Referring to FIG. 5A and FIG. 8B, the fourth conductive layer includes a third conductive portion 13, and the third conductive portion 13 includes the gate G4 of the fourth transistor T4, the gate G5 of the fifth transistor T5 and the gate G8 of the eighth transistor T8. That is, the gate G4 of the fourth transistor T4, the gate G5 of the fifth transistor T5 and the gate G8 of the eighth transistor T8 are connected to form an integral structure. The display substrate further includes a reset signal line 33 in the second conductive layer. The reset signal line 33 extends in the first direction X and is electrically connected to the third conductive portion 13. That is, the reset signal line 33 is electrically connected to the gate G4 of the fourth transistor T4, the gate G5 of the fifth transistor T5 and the gate G8 of the eighth transistor T8. The reset signal line 33 is used to provide the reset signal to the gate G4 of the fourth transistor T4, the gate G5 of the fifth transistor T5 and the gate G8 of the eighth transistor T8. For example, the fourth conductive layer is a single layer formed of metal molybdenum, and the second conductive layer is a stack formed of titanium layer/aluminum layer/titanium layer. As the sheet resistance of the fourth conductive layer is greater than the sheet resistance of the second conductive layer, based on the above arrangement, it is possible to effectively reduce the wiring resistance of the reset signal line 33 used to transmit the reset signal, so that the voltage drop (IR Drop) in the transmission of the reset signal may be reduced and the uniformity of distribution of the reset signal may be improved, thereby improving the display uniformity of the display substrate.

According to some exemplary embodiments, referring to FIG. 5A and FIG. 8A, the fourth transistor T4 is a dual-gate transistor, and the gate of the fourth transistor T4 includes a first gate G41 and a second gate G42.

According to some exemplary embodiments, referring to FIG. 5B to FIG. 5D, the second insulation layer is arranged between the fourth conductive layer and the second conductive layer. The second insulation layer includes a plurality of sixth via holes V06, the sixth via hole V06 exposes at least part of the third conductive portion 13, and the reset signal line 33 is electrically connected to the plurality of third conductive portions 13 through the plurality of sixth via holes V06.

Figure 6:
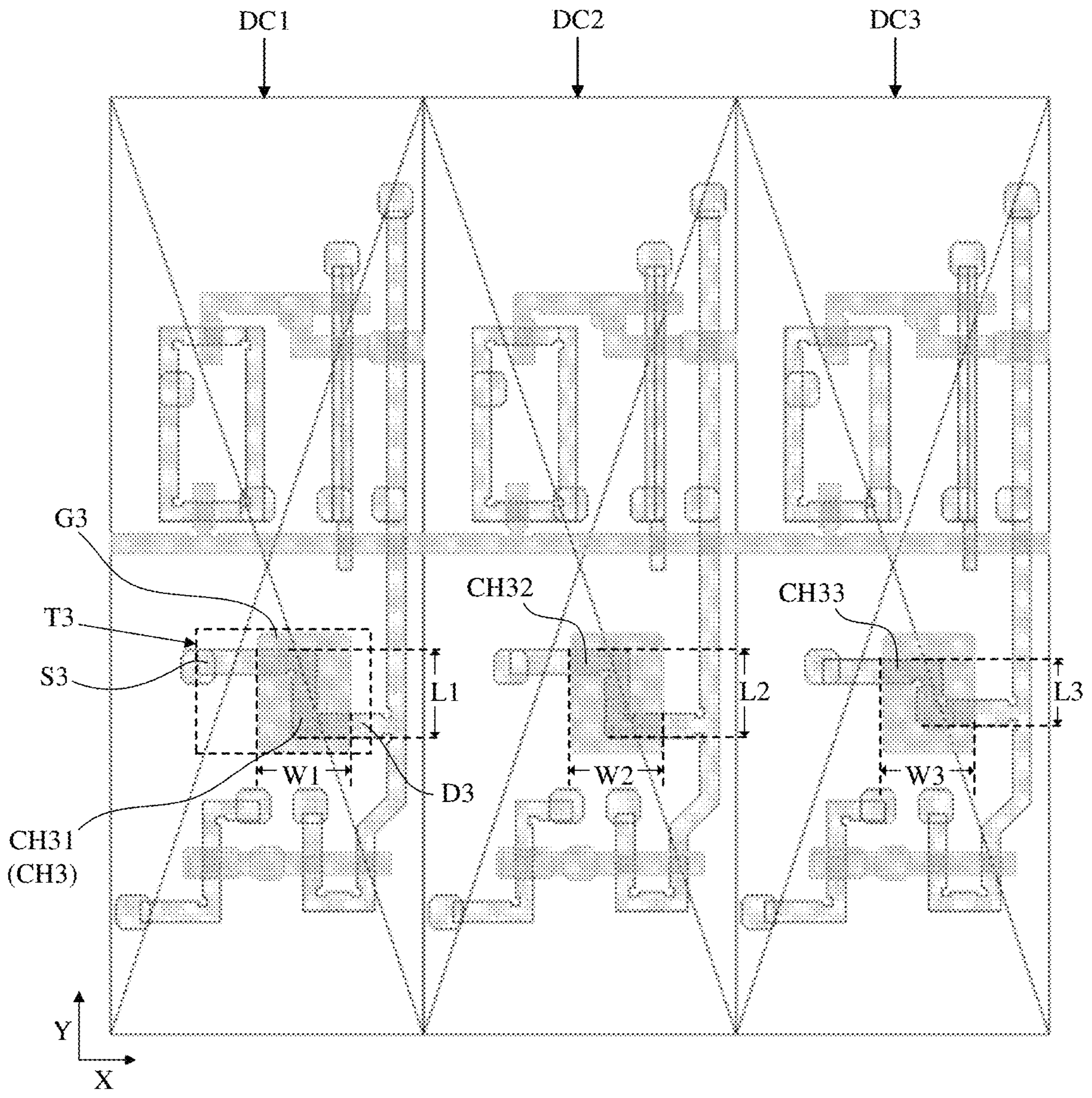
FIG. 6 schematically shows a plan view of a combination of an active layer and a fourth conductive layer in a display substrate according to some embodiments of the present disclosure.

FIG. 6 schematically shows a plan view of a combination of an active layer and a fourth conductive layer in a display substrate according to some embodiments of the present disclosure.

According to some exemplary embodiments, referring to FIG. 6, the plurality of sub-pixels include a first sub-pixel, a second sub-pixel and a third sub-pixel. The first sub-pixel includes a first driving circuit DC1 and a first light-emitting element electrically connected to the first driving circuit DC1, the second sub-pixel includes a second driving circuit DC2 and a second light-emitting element electrically connected to the second driving circuit DC2, and the third sub-pixel includes a third driving circuit DC3 and a third light-emitting element electrically connected to the third driving circuit DC3. The third transistor T3 includes the active portion and the gate G3. A portion of the active portion of the third transistor T3 overlapping with the gate G3 serves as a channel portion CH3 of the third transistor T3. The active portion of the third transistor T3 further includes a first electrode S3 and a second electrode D3, and the first electrode S3 and the second electrode D3 are connected to the channel portion CH3 on opposite sides of the channel portion CH3 in the first direction X, respectively.

The third transistor T3 in the first driving circuit DC1 includes a first channel portion CH31, the third transistor T3 in the second driving circuit DC2 includes a second channel portion CH32, and the third transistor T3 in the third driving circuit DC3 includes a third channel portion CH33. As light-emitting currents of the first light-emitting element, the second light-emitting element and the third light-emitting element are different from each other, it is possible to adjust respective third transistors T3, for example, the sizes of the channel portions of driving transistors, of the first driving circuit DC1, the second driving circuit DC2 and the third driving circuit DC3 based on the light-emitting currents of the first light-emitting element, the second light-emitting element and the third light-emitting element, respectively.

For example, referring to FIG. 6, a ratio of a size W1 of the first channel portion CH31 in the first direction X to a size L1 of the first channel portion CH31 in the second direction Y is different from a ratio of a size W2 of the second channel portion CH32 in the first direction X to a size L2 of the second channel portion CH32 in the second direction Y.

For example, referring to FIG. 6, a ratio of a size W1 of the first channel portion CH31 in the first direction X to a size L1 of the first channel portion CH31 in the second direction Y is different from a ratio of a size W3 of the third channel portion CH33 in the first direction X to a size L3 of the third channel portion CH33 in the second direction Y.

For example, referring to FIG. 6, a ratio of the size W2 of the second channel portion CH32 in the first direction X to a size L2 of the second channel portion CH32 in the second direction Y is different from a ratio of a size W3 of the third channel portion CH33 in the first direction X to a size L3 of the third channel portion CH33 in the second direction Y.

According to some exemplary embodiments, referring to FIG. 6, the first light-emitting element emits red light, the second light-emitting element emits green light, and the third light-emitting element emits blue light. As the light-emitting current of the third light-emitting element emitting blue light is larger than that of the second light-emitting element emitting green light and that of the first light-emitting element emitting red light, a size of the third channel portion CH33 may be set to be different from a size of the second channel portion CH32 and a size of the first channel portion CH31.

For example, the ratio of the size W3 of the third channel portion CH33 in the first direction X to the size L3 of the third channel portion CH33 in the second direction Y is greater than the ratio of the size W1 of the first channel portion CH31 in the first direction X to the size L1 of the first channel portion CH31 in the second direction Y.

For example, the ratio of the size W3 of the third channel portion CH33 in the first direction X to the size L3 of the third channel portion CH33 in the second direction Y is greater than the ratio of the size W2 of the second channel portion CH32 in the first direction X to the size L2 of the second channel portion CH32 in the second direction Y.

According to some exemplary embodiments, referring to FIG. 6, the size W3 of the third channel portion CH33 in the first direction X is equal to the size W1 of the first channel portion CH31 in the first direction X, and the size L3 of the third channel portion CH33 in the second direction Y is smaller than the size L1 of the first channel portion CH31 in the second direction Y. The size W3 of the third channel portion CH33 in the first direction X is equal to the size W2 of the second channel portion CH32 in the first direction X, and the size L3 of the third channel portion CH33 in the second direction Y is smaller than the size L2 of the second channel portion CH32 in the second direction Y.

According to some exemplary embodiments, the size of the third channel portion in the first direction is larger than the size of the first channel portion in the first direction, and the size of the third channel portion in the second direction is smaller than the size of the first channel portion in the second direction. The size of the third channel portion in the first direction is larger than the size of the second channel portion in the first direction, and the size of the third channel portion in the second direction is smaller than the size of the second channel portion in the second direction.

According to some exemplary embodiments, the size of the third channel portion in the first direction is larger than the size of the first channel portion in the first direction, and the size of the third channel portion in the second direction is equal to the size of the first channel portion in the second direction. The size of the third channel portion in the first direction is larger than the size of the second channel portion in the first direction, and the size of the third channel portion in the second direction is equal to the size of the second channel portion in the second direction.

According to some exemplary embodiments, referring to FIG. 6, the channel portion CH3 of the third transistor T3 is in a shape of "Z".

Figure 7A:
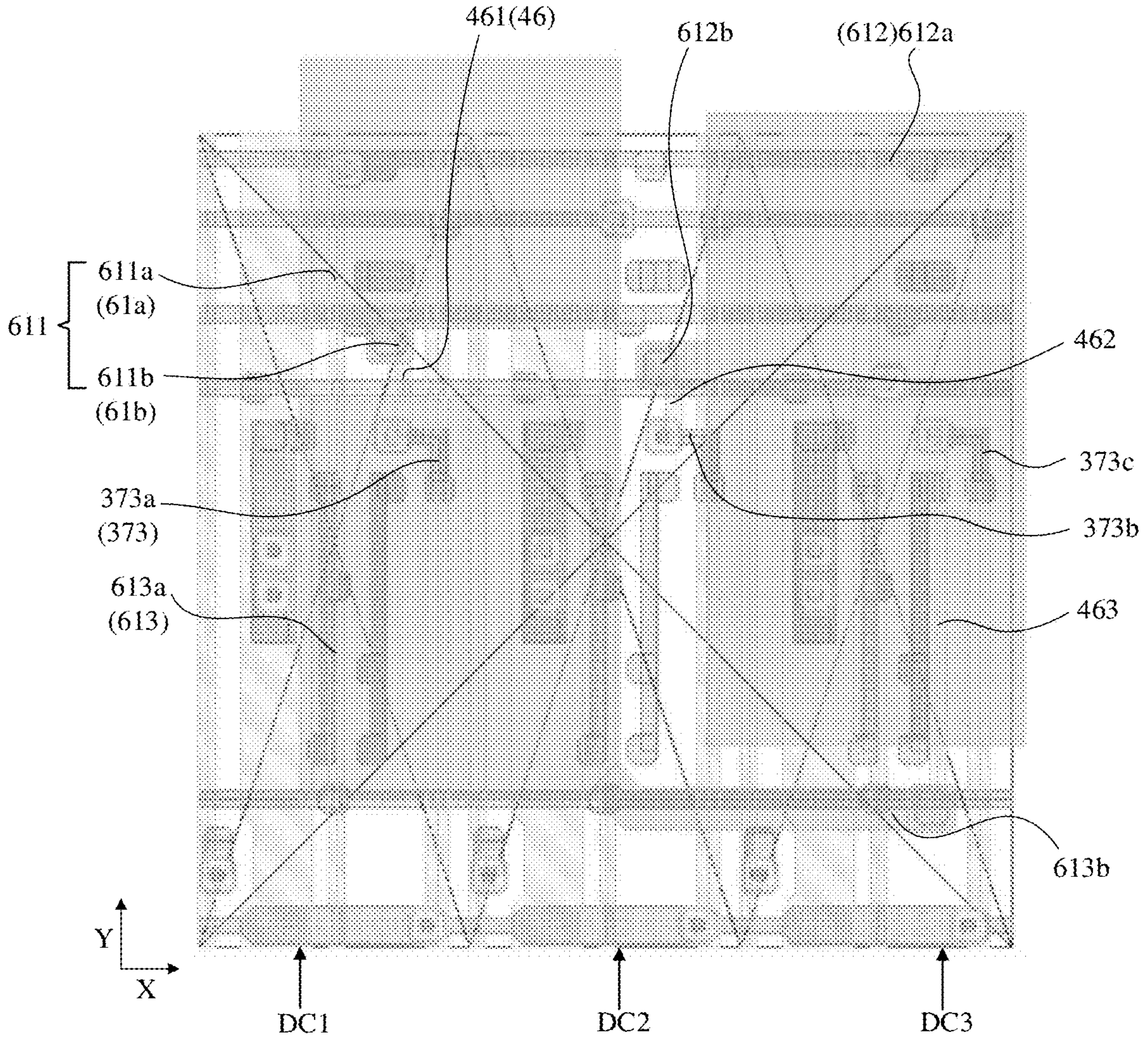
Figure 7B:
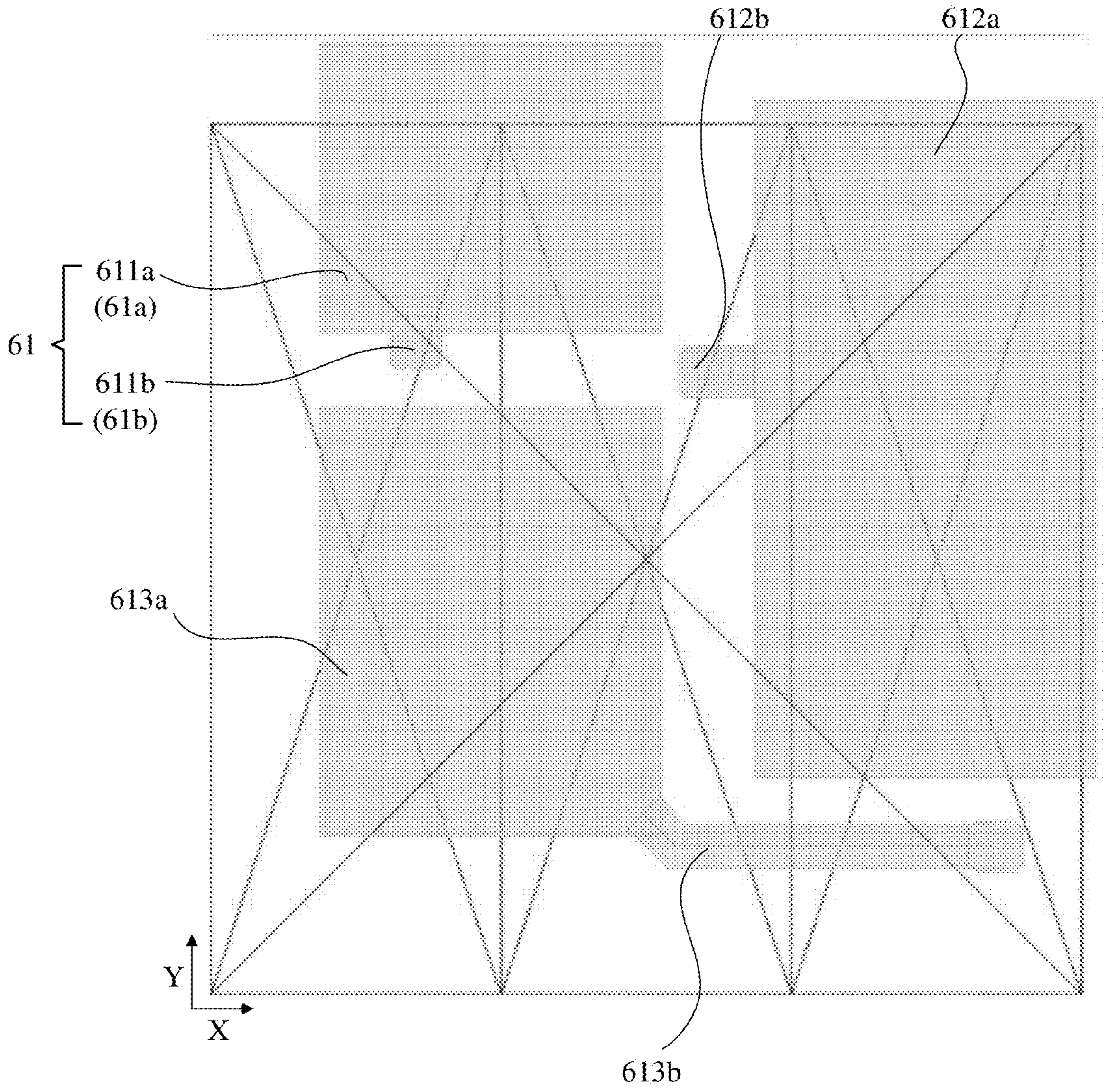
Figure 7C:
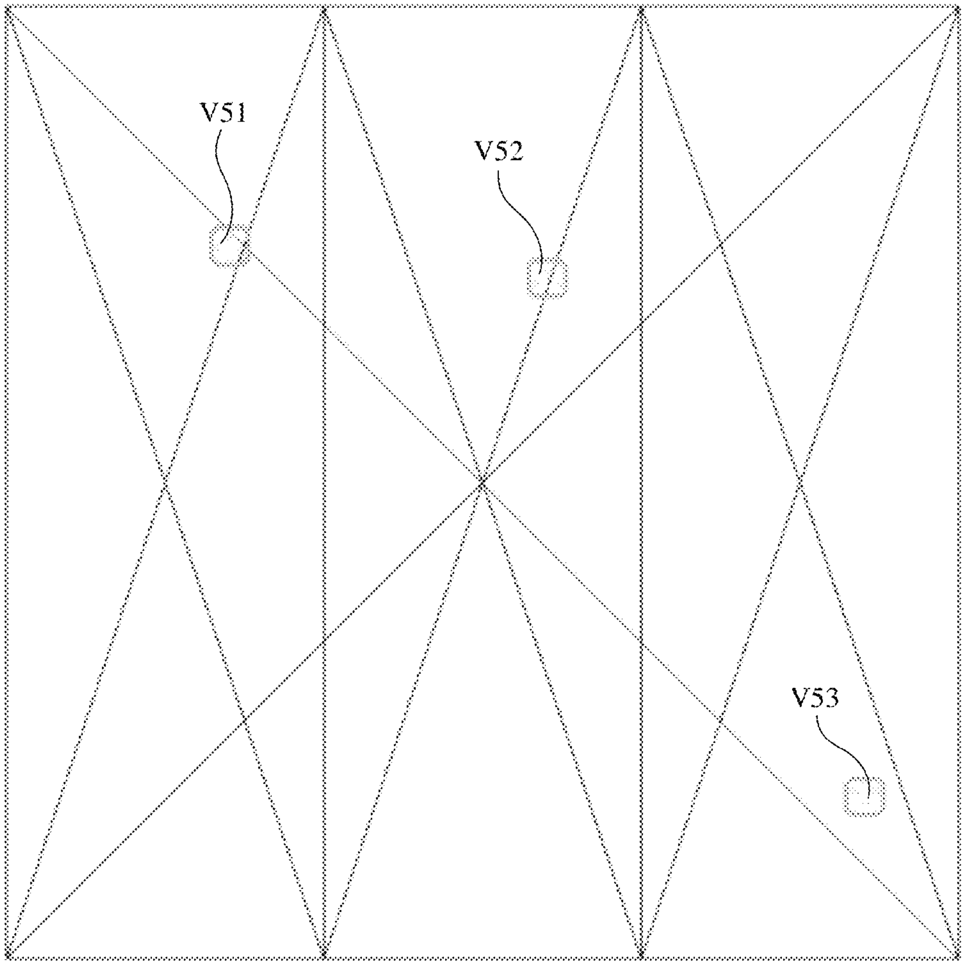
Figure 7D:
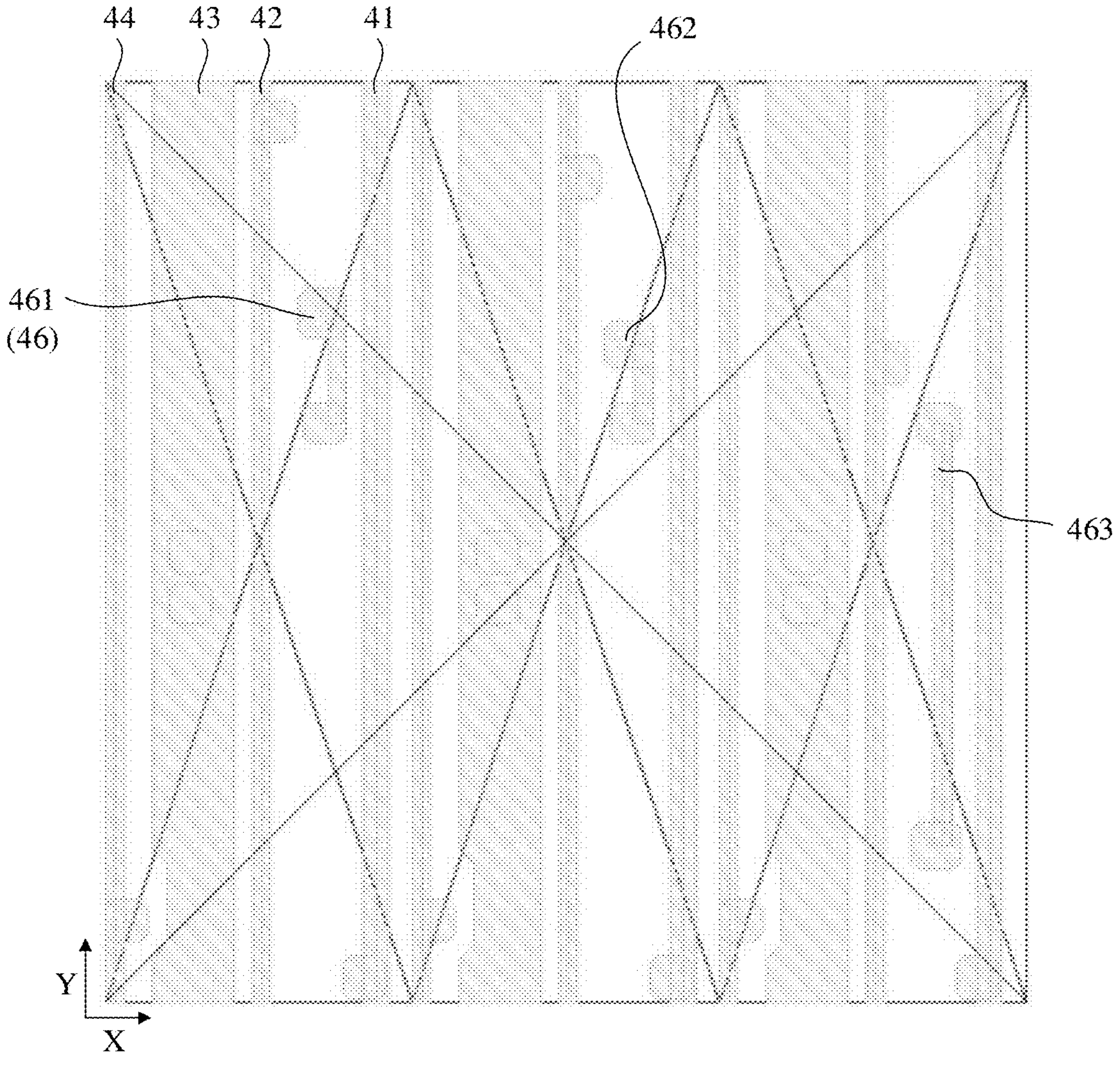
Figure 7E:
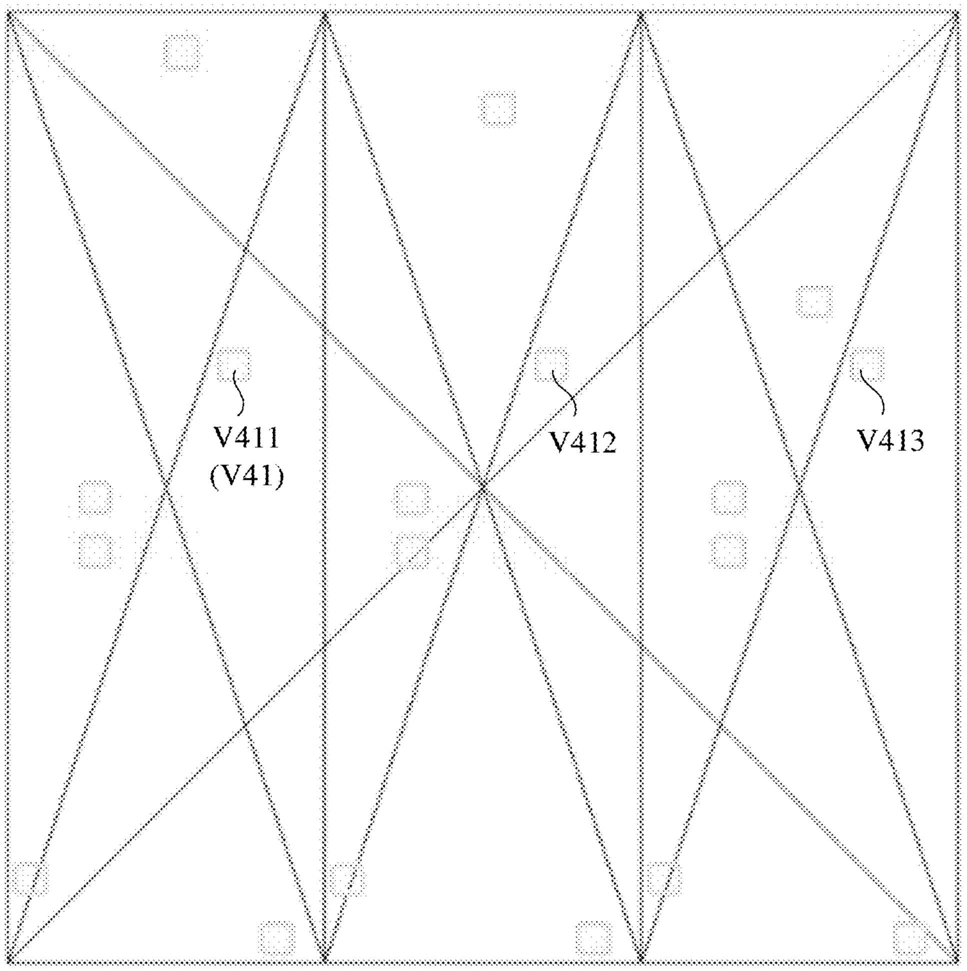
Figure 7F:
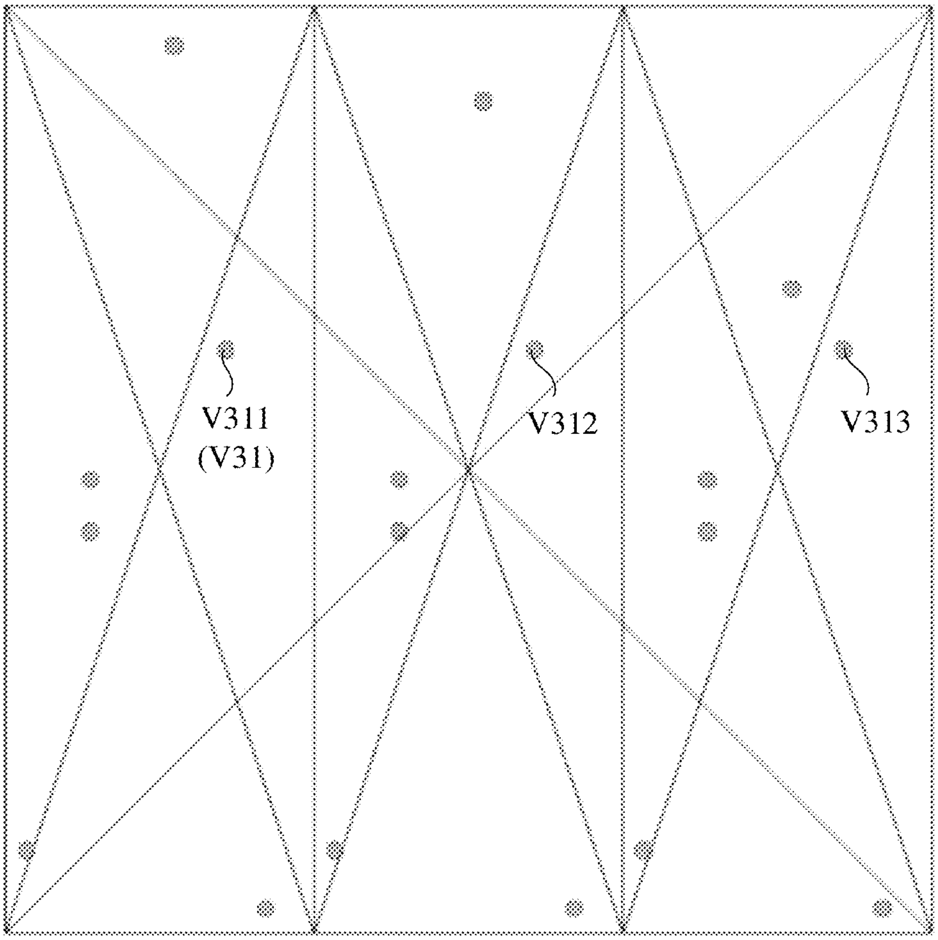
Figure 7G:
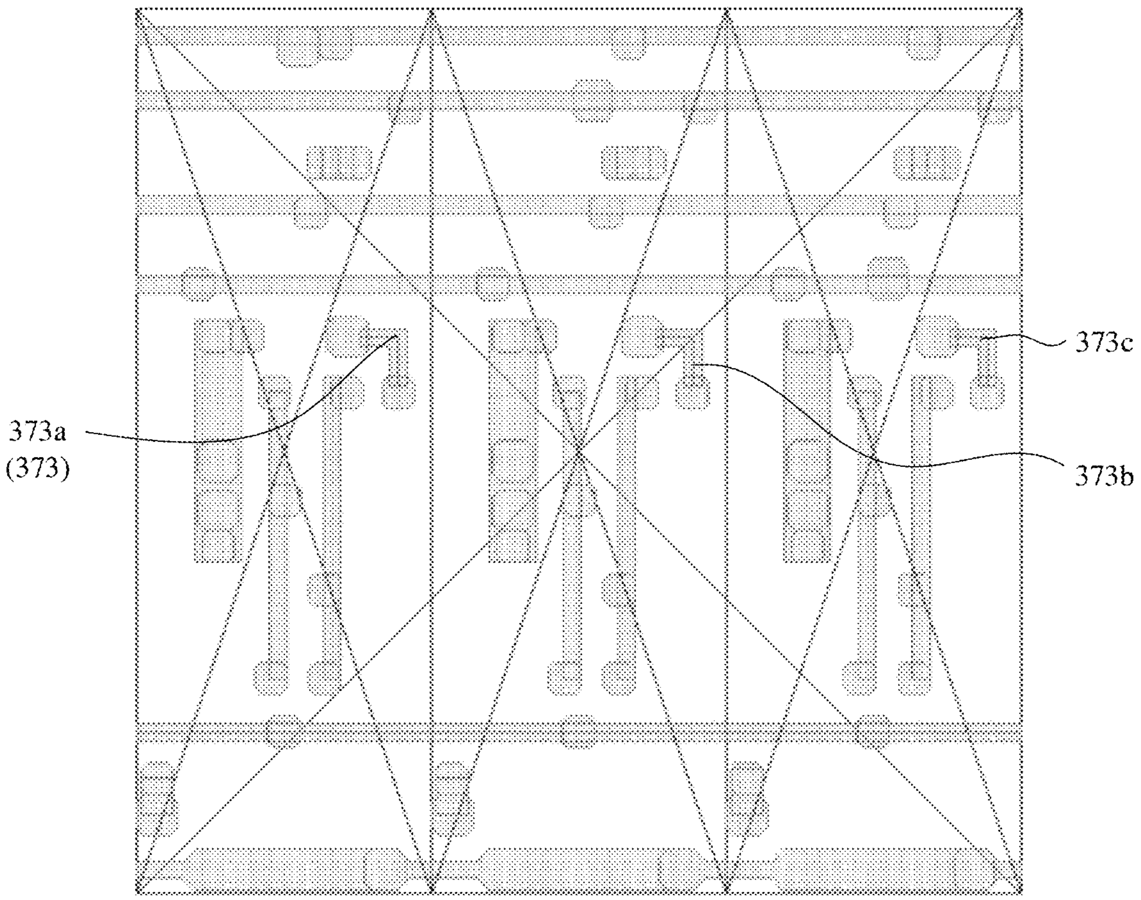
Figure 7H:
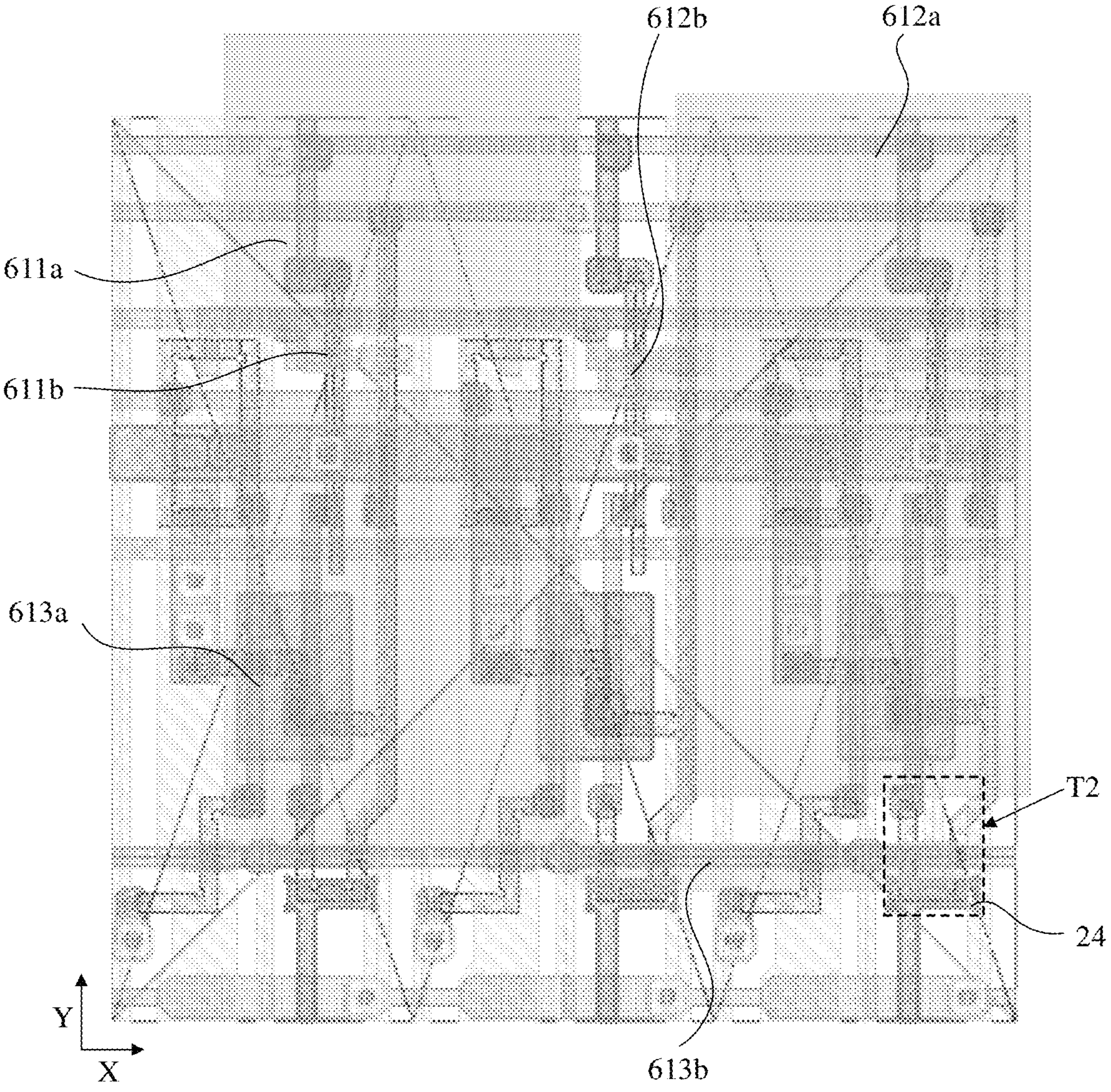
FIG. 7H shows a plan view of a combination of an active layer, a fourth conductive layer, a third conductive layer, a second conductive layer, a first conductive layer and a first electrode layer.

FIG. 7A to FIG. 7G are plan views of some film layers of a display substrate arranged in a display region according to some exemplary embodiments of the present disclosure. FIG. 7A shows a plan view of a combination of a second conductive layer, a first conductive layer and a first electrode layer; FIG. 7B shows a first electrode layer; FIG. 7C shows a second planarization layer; FIG. 7D shows a first conductive layer; FIG. 7E shows a first planarization layer; FIG. 7F shows a passivation layer; FIG. 7G shows a second conductive layer; and FIG. 7H shows a plan view of a combination of an active layer, a fourth conductive layer, a third conductive layer, a second conductive layer, a first conductive layer and a first electrode layer.

According to some exemplary embodiments, the display substrate includes the second conductive layer on the base substrate, the first insulation layer on a side of the second conductive layer away from the base substrate, the first conductive layer on a side of the first insulation layer away from the base substrate, a third insulation layer on a side of the first conductive layer away from the base substrate, and the first electrode layer on a side of the third insulation layer away from the base substrate. For example, the first insulation layer includes a passivation layer on the side of the second conductive layer away from the base substrate and a first planarization layer on a side of the passivation layer away from the base substrate; and the third insulation layer includes a second planarization layer.

Referring to FIG. 7B, the first electrode layer includes a plurality of first electrodes 61, and the first electrode 61 includes a first electrode main body portion 61*a* and a first electrode connection portion 61*b* connected to the first electrode main body portion 61*a*. Referring to FIG. 7D, the first conductive layer includes a plurality of first transfer portions 46. Referring to FIG. 7G, the second conductive layer includes a plurality of second transfer portions 373. Referring to FIG. 7F, the passivation layer includes a plurality of via holes V31. Referring to FIG. 7E, the first planarization layer includes a plurality of via holes V41. Referring to FIG. 7E, FIG. 7F and FIG. 7G, an orthographic projection of the via hole V41 on the base substrate covers an orthographic projection of the via hole V31 on the base substrate, and the via hole V41 and the via hole V31 jointly expose at least part of the second transfer portion 373.

Referring to FIG. 7A, the first electrode connection portion 61*b* is electrically connected to the first transfer portion 46, the first transfer portion 46 is electrically connected to the second transfer portion 373 through via holes V41 and V31, and the second transfer portion 373 is electrically connected to the driving circuit. That is, the first electrode connection portion 61*b* in the first electrode 61 is electrically connected to the driving circuit through the first transfer portion 46 and the second transfer portion 373. On this basis, by arranging the transfer structure for connecting the first electrode layer and the driving circuit to overlap with the first electrode layer, the plurality of first electrodes 61 in the first electrode layer are arranged more compactly, thereby improving the resolution of the display substrate.

For example, referring to FIG. 7A, FIG. 7E and FIG. 7F, the via holes V41 and the via holes V31 partially overlap with the first electrode main body portions 61*a*. That is, orthographic projections of the plurality of first electrode main body portions 61*a* on the base substrate cover at least part of orthographic projections of the plurality of via holes V41 and the plurality of via holes V31 on the base substrate.

For example, referring to FIG. 7A, the first transfer portions 46 partially overlap with the first electrode main body portions 61*a*. That is, orthographic projections of the plurality of first electrode main body portions 61*a* on the base substrate cover at least part of orthographic projections of the plurality of first transfer portions 46 on the base substrate.

For example, referring to FIG. 7A, the second transfer portions 373 partially overlap with the first electrode main body portions 61*a*. That is, orthographic projections of the plurality of first electrode main body portions 61*a* on the base substrate cover at least part of orthographic projections of the plurality of second transfer portions 373 on the base substrate.

According to some exemplary embodiments, referring to FIG. 7A, which schematically shows a pixel unit in the display substrate, where the pixel unit includes three sub-pixels, such as a first sub-pixel, a second sub-pixel and a third sub-pixel. The first sub-pixel includes the first driving circuit DC1 and the first light-emitting element, the second sub-pixel includes the second driving circuit DC2 and the second light-emitting element, and the third sub-pixel includes the third driving circuit DC3 and the third light-emitting element. In the pixel unit, the first driving circuit DC1, the second driving circuit DC2 and the third driving circuit DC3 are arranged in sequence in the first direction X. The plurality of first electrodes 61 include a plurality of first sub-electrodes 611, a plurality of second sub-electrodes 612 and a plurality of third sub-electrodes 613. The first sub-electrode 611 serves as an anode of the first light-emitting element, the second sub-electrode 612 serves as an anode of the second light-emitting element, and the third sub-electrode 613 serves as an anode of the third light-emitting element. The plurality of first transfer portions 46 include a plurality of first transfer sub-portions 461, a plurality of second transfer sub-portions 462 and a plurality of third transfer sub-portions 463.

The first sub-electrode 611 is spaced apart from the third sub-electrode 613 in the second direction Y, and the second sub-electrode 612 is arranged on a side of the first sub-electrode 611 and the third sub-electrode 613 in the first direction X. An orthographic projection of the first sub-electrode 611 on the base substrate partially overlaps with each of an orthographic projection of the first driving circuit DC1 on the base substrate and an orthographic projection of the second driving circuit DC2 on the base substrate. An orthographic projection of the third sub-electrode 613 on the base substrate partially overlaps with each of the orthographic projection of the first driving circuit DC1 on the base substrate and the orthographic projection of the second driving circuit DC2 on the base substrate. An orthographic projection of the second sub-electrode 612 on the base substrate partially overlaps with each of the orthographic projection of the third driving circuit DC3 on the base substrate and the orthographic projection of the second driving circuit DC2 on the base substrate.

Referring to FIG. 7A to FIG. 7H, the first sub-electrode 611 includes a first sub-electrode main body portion 611*a* and a first sub-electrode connection portion 611*b*, and the first sub-electrode connection portion 611*b* is connected to an edge of the first sub-electrode main body portion 611*a* facing the third sub-electrode 613. An end of the first transfer sub-portion 461 is electrically connected to the first sub-electrode connection portion 611*b* through a first via hole V51 in the second planarization layer, and the other end of the first transfer sub-portion 461 extends in the second direction Y and is electrically connected to a $1^{st}$ second transfer portion 373*a* through a first via hole V411 in the first planarization layer and a first via hole V311 in the passivation layer.

Referring to FIG. 7A to FIG. 7H, the second sub-electrode 612 includes a second sub-electrode main body portion 612*a* and a second sub-electrode connection portion 612*b*, and the second sub-electrode connection portion 612*b* is connected to an edge of the second sub-electrode main body portion 612*a* facing the first sub-electrode 611 and the third sub-electrode 613. An end of the second transfer sub-portion 462 is electrically connected to the second sub-electrode connection portion 612*b* through a second via hole V52 in the second planarization layer, and the other end of the second transfer sub-portion 462 extends in the second direction Y and is electrically connected to a $2^{nd}$ second transfer portion 373*b* through a second via hole V412 in the first planarization layer and a second via hole V312 in the passivation layer.

Referring to FIG. 7A to FIG. 7H, the third sub-electrode 613 includes a third sub-electrode main body portion 613*a* and a third sub-electrode connection portion 613*b*, and the third sub-electrode connection portion 613*b* is connected to a corner portion of the third sub-electrode main body portion 613*a* away from the first sub-electrode 611 and facing the second sub-electrode 612. The third sub-electrode connection portion 613*b* extends in the first direction X and is electrically connected to an end of the third transfer sub-portion 463 through a third via hole V53 in the second planarization layer. The other end of the third transfer sub-portion 463 extends in the second direction Y and is electrically connected to a $3^{rd}$ second transfer portion 373*c* through a third via hole V413 in the first planarization layer and a third via hole V313 in the passivation layer.

Referring to FIG. 7A, in order to compactly arrange the sub-pixels in the pixel unit, the transfer structure for electrically connecting the first electrode to the driving circuit may be arranged to overlap with the first electrode layer. For example, an orthographic projection of the second sub-electrode main body portion 612*a* on the base substrate covers an orthographic projection of the $3^{rd}$ second transfer portion 373*c* on the base substrate, and the orthographic projection of the second sub-electrode main body portion 612*a* on the base substrate covers a portion of an orthographic projection of the third transfer sub-portion 463 on the base substrate. The orthographic projection of the second sub-electrode main body portion 612*a* on the base substrate covers a portion of an orthographic projection of the $2^{nd}$ second transfer portion 373*b* on the base substrate. An orthographic projection of the third sub-electrode main body portion 613*a* on the base substrate covers an orthographic projection of the $1^{st}$ second transfer portion 373*a* on the base substrate, and the orthographic projection of the third sub-electrode main body portion 613*a* on the base substrate covers an orthographic projection of the first transfer sub-portion 461 on the base substrate.

According to some exemplary embodiments, referring to FIG. 7D, the first conductive layer includes the data line 44, the first power signal line 43, the grid line 42 and the second power signal line 41 that are arranged in the first direction X. The first transfer portion 46 is in a shape of a strip extending in the second direction Y, and the first transfer portion 46 is arranged between the grid line 42 and the second power signal line 41.

According to some exemplary embodiments, referring to FIG. 7H, the display substrate may further include a shielding portion 24 in the second conductive layer, and an orthographic projection of the shielding portion 24 on the base substrate at least partially overlaps with an orthographic projection of the channel portion of the second transistor T2 on the base substrate. The shielding portion 24 is used to shield at least part of the light incident to the channel portion of the second transistor T2, which may effectively reduce the leakage probability of the second transistor T2 so as to improve the operating stability of the driving circuit.

According to some exemplary embodiments, referring to FIG. 2, the pixel circuit has a 9T1C pixel circuit structure, and the pixel circuit includes one storage capacitor C1 and nine transistors T1 to T9. For example, all transistors are N-type transistors, the third transistor T3 is a driving transistor, and the other transistors are switching transistors.

Referring to FIG. 2, the first electrode of the first transistor T1 is used to receive the data signal Vdata, and the second electrode of the first transistor T1 is electrically connected to the second electrode plate of the first storage capacitor C1. The first electrode of the second transistor T2 is electrically connected to the second electrode of the third transistor T3, and the second electrode of the second transistor T2 is electrically connected to the gate of the third transistor T3. The first electrode of the third transistor T3 is used to receive the first power signal VDD, and the gate of the third transistor T3 is electrically connected to the first electrode plate of the storage capacitor C1. The first electrode of the fourth transistor T4 is used to receive the first initialization signal Vinit1, and the second electrode of the fourth transistor T4 is electrically connected to the gate of the third transistor T3. The first electrode of the fifth transistor T5 is used to receive the reference voltage signal Vref, and the second electrode of the fifth transistor T5 is electrically connected to the second electrode D1 of the first transistor T1. The first electrode of the sixth transistor T6 is used to receive the reference voltage signal Vref, and the second electrode of the sixth transistor T6 is electrically connected to the second electrode of the first transistor T1. The first electrode of the seventh transistor T7 is electrically connected to the second electrode of the third transistor T3, and the second electrode of the seventh transistor T7 is electrically connected to the first electrode of the light-emitting element. The first electrode of the eighth transistor T8 is used to receive the second initialization signal Vinit2, and the second electrode of the eighth transistor T8 is electrically connected to the first electrode of the light-emitting element. The first electrode of the ninth transistor T9 is electrically connected to the gate of the third transistor T3, and the second electrode of the ninth transistor T9 is floating.

Each of the gate of the first transistor T1 and the gate of the second transistor T2 is used to receive the scanning signal Gate. Each of the gate of the fourth transistor T4, the gate of the fifth transistor T5 and the gate of the eighth transistor T8 is used to receive the reset signal Reset. Each of the gate of the sixth transistor T6 and the gate of the seventh transistor T7 is used to receive a light-emitting control signal EM.

The gate of the third transistor T3, the first electrode plate of the storage capacitor, the second electrode of the second transistor T2 and the first electrode of the ninth transistor T9 are coupled at a first node N1. The second electrode plate of the storage capacitor, the second electrode of the first transistor T1, the second electrode of the fifth transistor T5 and the second electrode of the sixth transistor T6 are coupled at a second node N2. The second electrode of the seventh transistor T7, the second electrode D8 of the eighth transistor T8 and the first electrode of the light-emitting element are coupled at a third node N3.

According to some exemplary embodiments, the process of driving the driving circuit includes three phases: a first phase, a second phase and a third phase, which are described below with reference to FIG. 2.

In the first phase, under the control of the reset signal Reset, the fourth transistor T4 is turned on, the first initialization signal Vinit1 initializes the first node N1, and the potential at the first node N1 at this point is the potential of the first initialization signal Vinit1; the fifth transistor T5 is turned on, the reference voltage signal Vref is written into the second node N2; the eighth transistor T8 is turned on, residual charges in a previous display frame is released, and the second initialization signal Vinit2 is written into the third node N3, for example, the first electrode of the light-emitting element.

In the second phase, under the control of the scanning signal Gate, the first transistor T1 is turned on, and the data signal Vdata is written into the second node N2; the second transistor T2 is turned on, the diode connection of the third transistor T3 is sampled, the potential at the first node N1 is raised to (VDD+Vth), and the third transistor T3 gradually switches from a turned-on state to a turned-off state, so as to compensate a threshold voltage Vth of the driving transistor T3.

In the third phase, under the control of the light-emitting control signal EM, the sixth transistor T6 is turned on, and the reference voltage signal Vref is written into the second node N2; the ninth transistor T9 is turned on to reduce a leakage of the first node N1 in the light-emitting phase. As the potential at the second node N2 jumps, the potential at the second node N2 becomes (VDD+Vth+Vref−Vdata). While, the seventh transistor T7 is turned on, the driving current is output, and the light-emitting element emits light.

According to some exemplary embodiments, the display substrate includes a base substrate, and an active layer, a first gate insulation layer, a first gate metal layer, a second gate insulation layer, a second gate metal layer, an interlayer insulation layer, a first source and drain metal layer, a passivation layer, a first planarization layer, a second source and drain metal layer, a second planarization layer, a first electrode layer, a pixel defining layer, a light-emitting function layer and a second electrode layer that are sequentially arranged on the base substrate in a direction away from the base substrate. The active layer, the first gate insulation layer, the first gate metal layer, the second gate insulation layer, the second gate metal layer, the interlayer insulation layer, the first source and drain metal layer, the passivation layer, the first planarization layer and the second source and drain metal layer form the driving circuit layer. The first electrode layer, the pixel defining layer, the light-emitting function layer and the second electrode layer form the light-emitting element layer. The first gate metal layer serves as the fourth conductive layer in the aforementioned embodiments, the second gate metal layer serves as the third conductive layer in the aforementioned embodiments, the first source and drain metal layer serves as the second conductive layer in the aforementioned embodiments, and the second source and drain metal layer serves as the first conductive layer in the aforementioned embodiments.

FIG. 8A to FIG. 8H are plan views of some layers of a display substrate arranged in a display region according to some exemplary embodiments of the present disclosure.

Figure 8C:
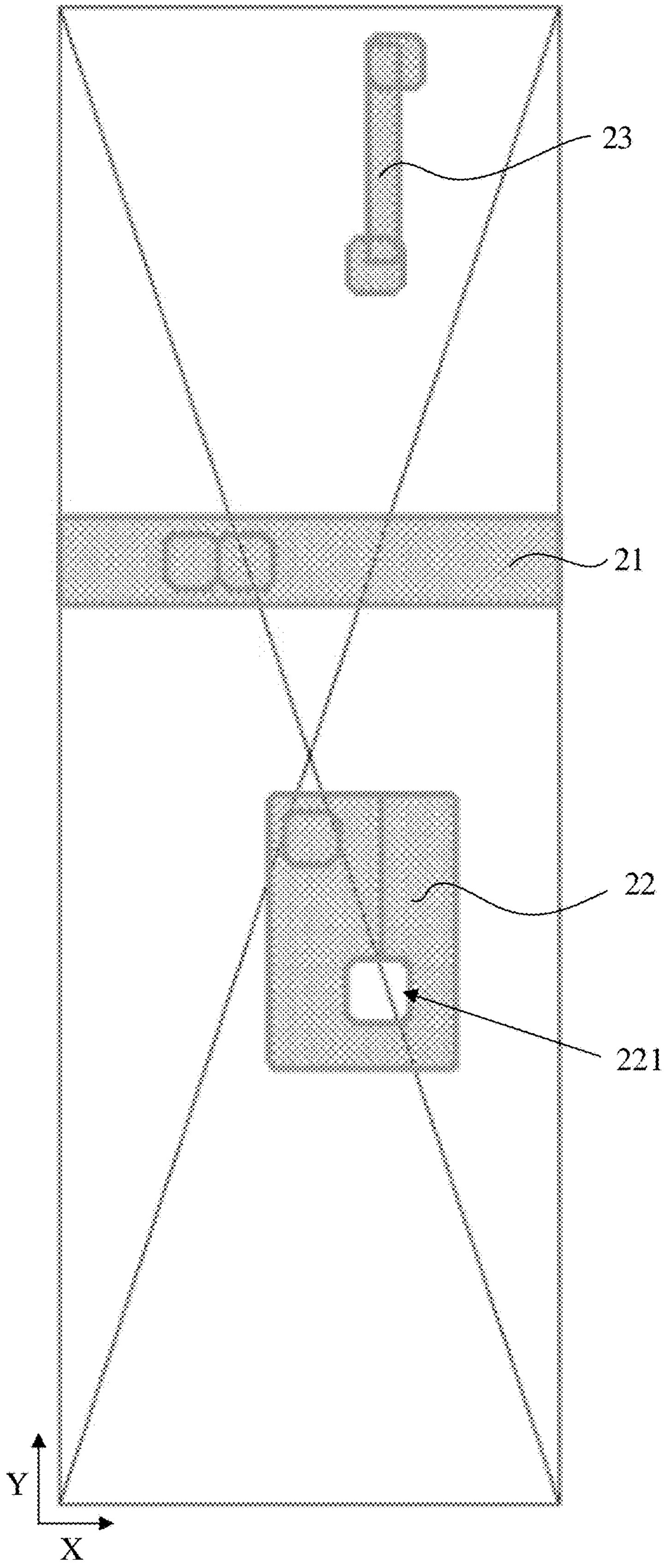
Figure 8D:
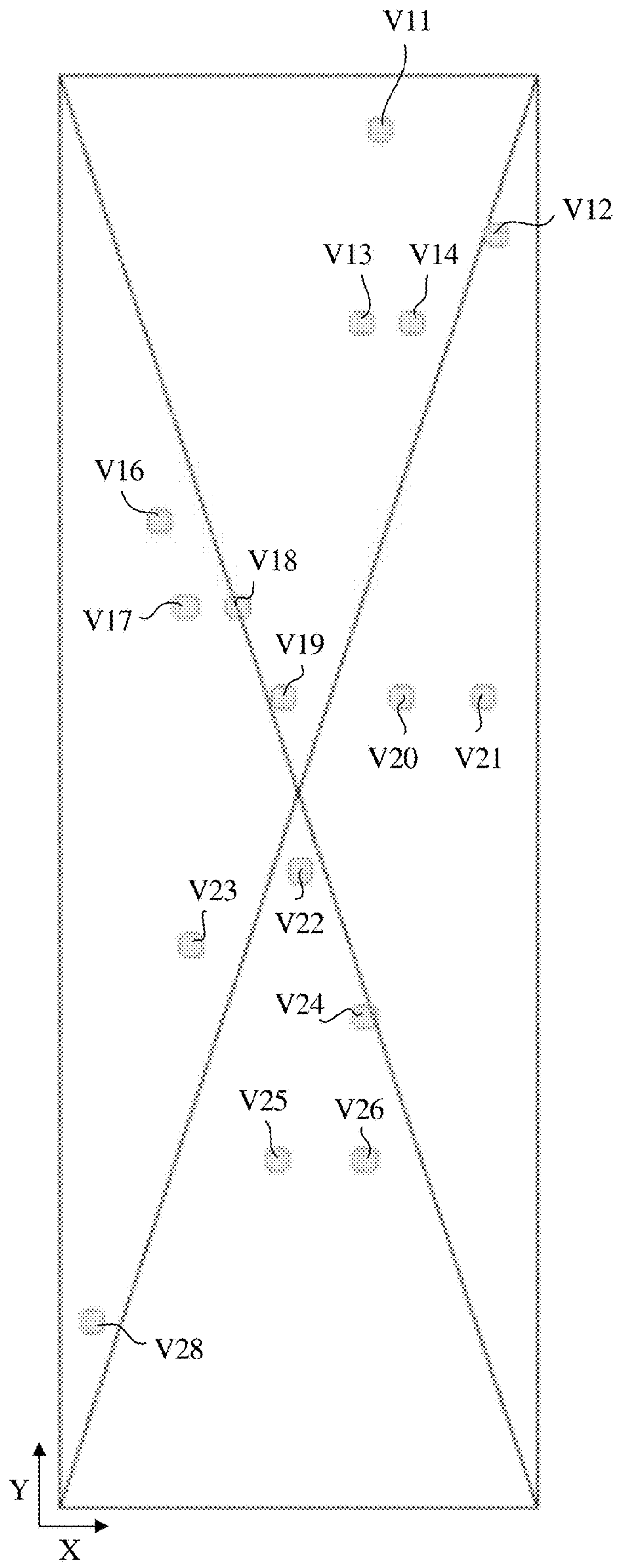
Figure 8E:
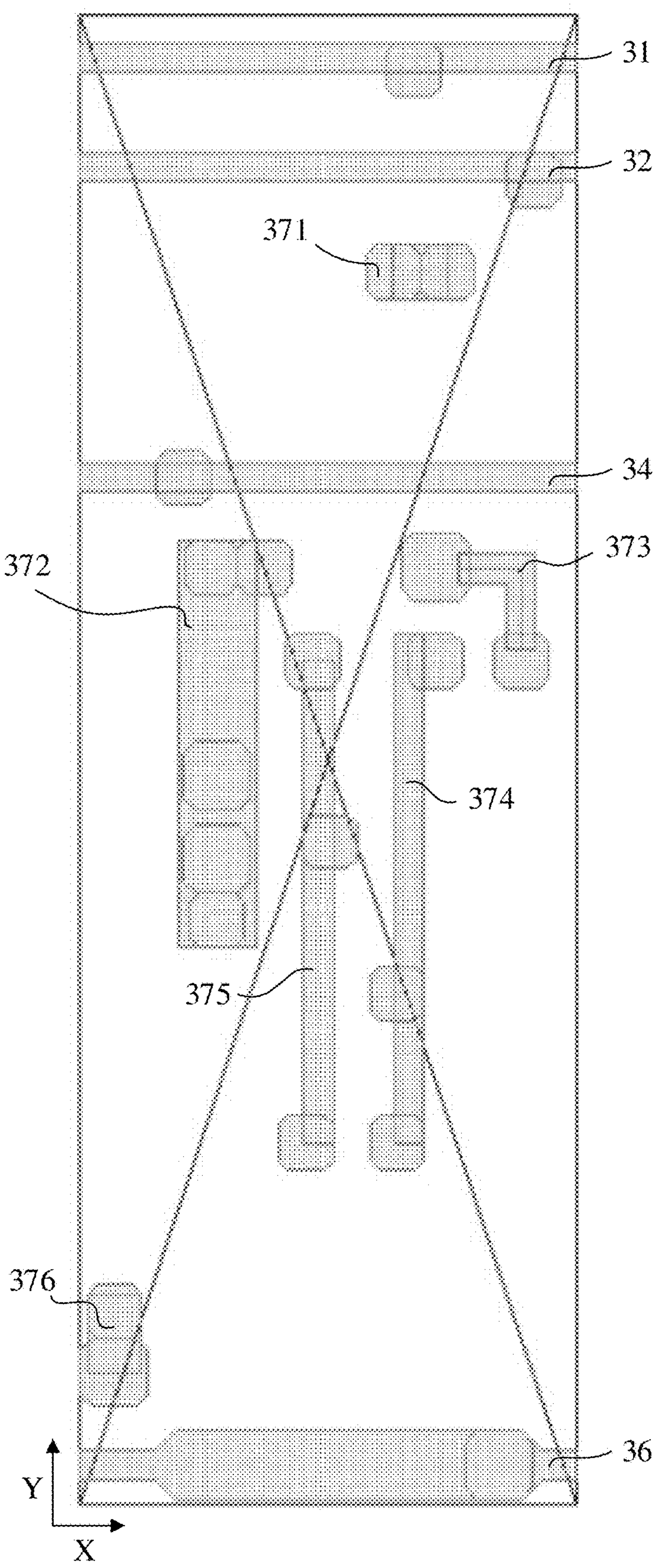
Figure 8F:
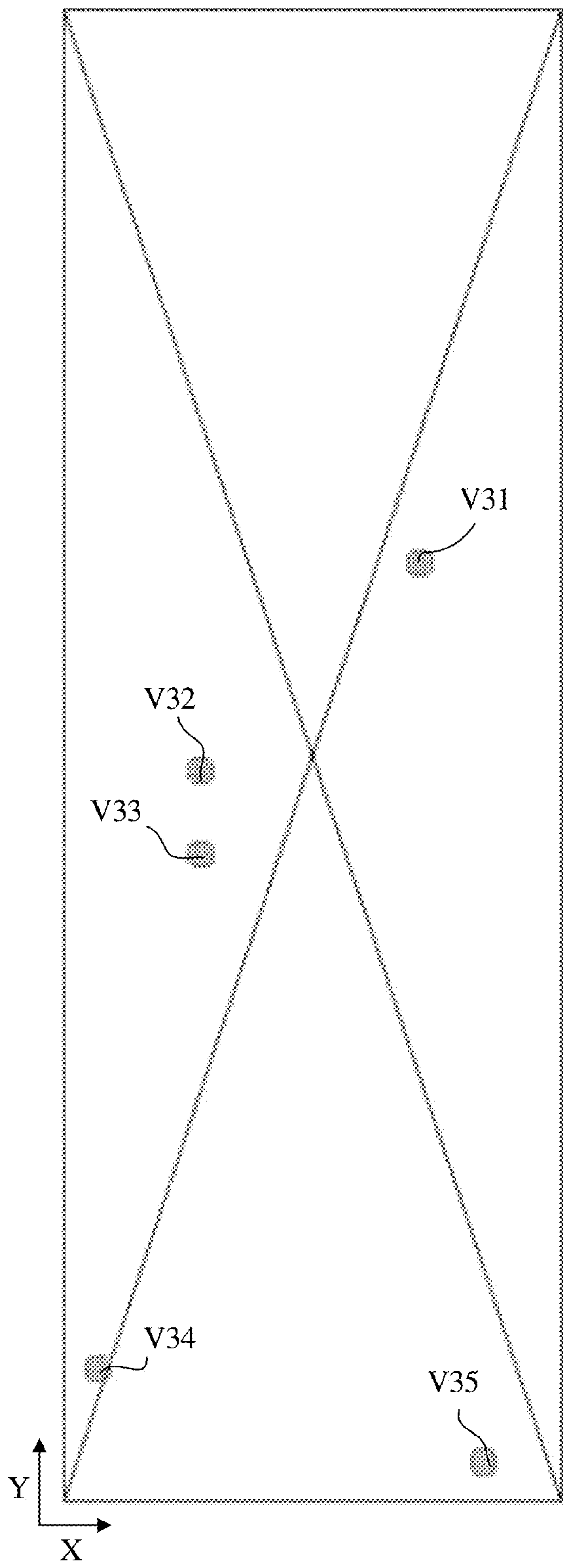
Figure 8G:
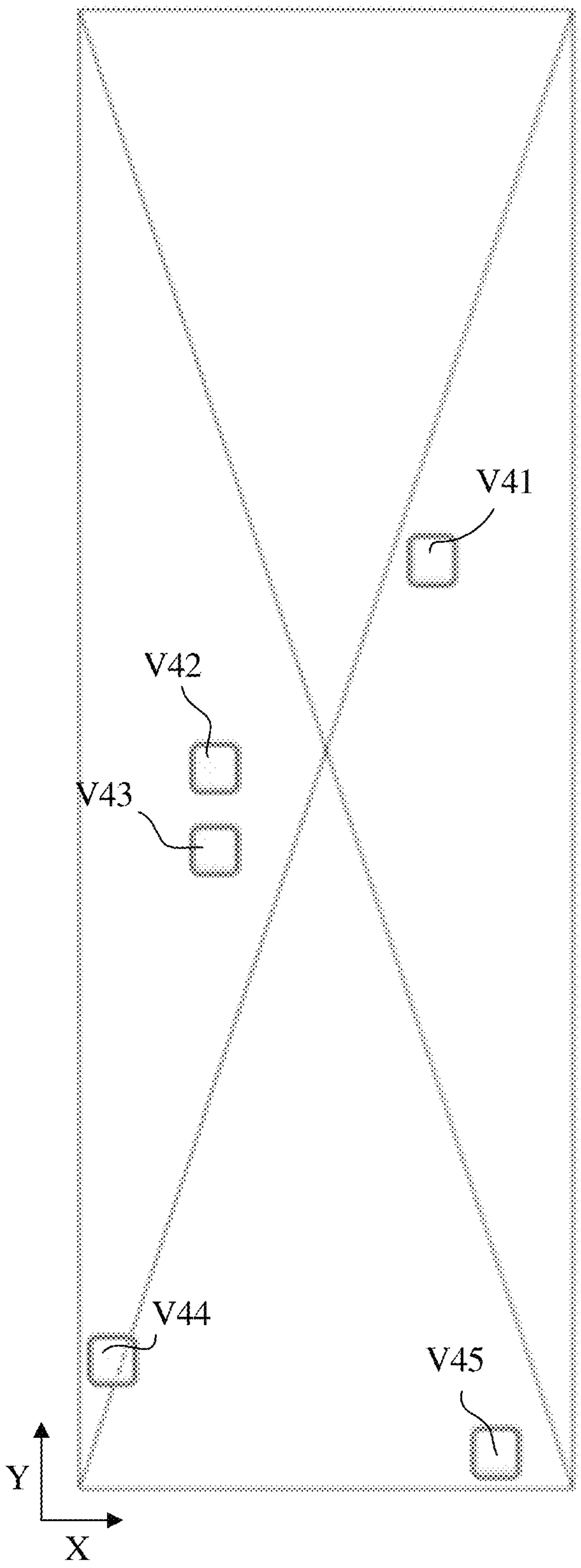
Figure 8H:
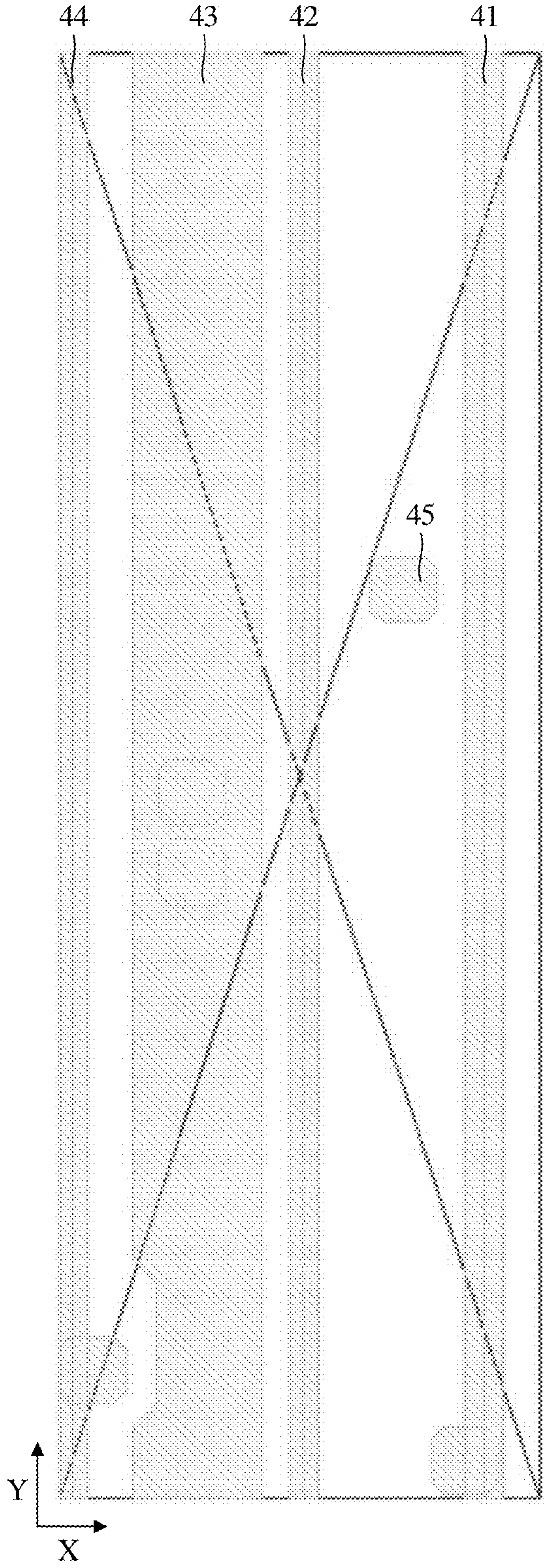

FIG. 8A shows an active layer; FIG. 8B shows a first gate metal layer; FIG. 8C shows a second gate metal layer; FIG. 8D shows an interlayer insulation layer; FIG. 8E shows a first source and drain metal layer; FIG. 8F shows a passivation layer; FIG. 8G shows a first planarization layer; and FIG. 8H shows a second source and drain metal layer.

According to some exemplary embodiments, referring to FIG. 8A, the active layer includes at least one of the active portions of the above transistors. In an example, the active layer includes the active portions of the first transistor T1, the second transistor T2, the third transistor T3, the fourth transistor T4, the fifth transistor T5, the sixth transistor T6, the seventh transistor T7, the eighth transistor T8, and the ninth transistor T9. The active portion of each transistor includes a channel portion, and a first electrode and a second electrode respectively connected to the channel portion on opposite sides of the channel portion. The channel portion, the first electrode and the second electrode of the transistor in the same pixel circuit are formed integrally. For example, the active portion of the first transistor T1 includes the channel portion CH1, and the first electrode S1 and the second electrode D1 respectively connected to the channel portion CH1 on opposite sides of the channel portion CH1. The active portion of the second transistor T2 includes the channel portion CH2, and the first electrode S2 and the second electrode D2 respectively connected to the channel portion CH2 on opposite sides of the channel portion CH2. The active portion of the third transistor T3 includes the channel portion CH3, and the first electrode S3 and the second electrode D3 respectively connected to the channel portion CH3 on opposite sides of the channel portion CH3. The active portion of the fourth transistor T4 includes the channel portion CH4, and the first electrode S4 and the second electrode D4 respectively connected to the channel portion CH4 on opposite sides of the channel portion CH4. The active portion of the fifth transistor T5 includes the channel portion CH5, and the first electrode S5 and the second electrode D5 respectively connected to the channel portion CH5 on opposite sides of the channel portion CH5. An active portion of the sixth transistor T6 includes the channel portion CH6, and the first electrode S6 and the second electrode D6 respectively connected to the channel portion CH6 on opposite sides of the channel portion CH6. An active portion of the seventh transistor T7 includes the channel portion CH7, and the first electrode S7 and the second electrode D7 respectively connected to the channel portion CH7 on opposite sides of the channel portion CH7. An active portion of the eighth transistor T8 includes the channel portion CH8, and the first electrode S8 and the second electrode D8 respectively connected to the channel portion CH8 on opposite sides of the channel portion CH8. The active portion of the ninth transistor T9 includes the channel portion CH9, and the first electrode S9 and the second electrode D9 respectively connected to the channel portion CH9 on opposite sides of the channel portion CH9.

For example, the second transistor T2 is a dual-gate dual-channel transistor. The channel portion CH2 of the second transistor T2 includes the first sub-channel portion CH21 and the second sub-channel portion CH22 that are spaced apart from each other, and the first sub-channel portion CH21 and the second sub-channel portion CH22 are connected to each other through the channel connection portion CH23.

For example, the fourth transistor T4 is a dual-gate dual-channel transistor. The channel portion CH4 of the fourth transistor T4 includes the first sub-channel portion CH41 and the second sub-channel portion CH42 that are spaced apart from each other, and the first sub-channel portion CH41 and the second sub-channel portion CH42 are connected to each other through the channel connection portion CH43.

For example, the active portion of the second transistor T2, the active portion of the third transistor T3, the active portion of the seventh transistor T7 and the active portion of the eighth transistor T8 are connected to form an integral structure.

For example, the active portion of the fourth transistor T4 and the active portion of the ninth transistor T9 are connected to form an integral structure.

For example, the active portion of the fifth transistor T5 and the active portion of the sixth transistor T6 are connected to form an integral structure.

For example, each of the active portion of the first transistor T1 and the active portion of the third transistor T3 is in a shape of "Z". Each of the active portion of the second transistor T2, the active portion of the fifth transistor T5, and the active portion of the sixth transistor T6 is in a shape of "U". Each of the active portion of the fourth transistor T4, the active portion of the seventh transistor T7, the active portion of the eighth transistor T8, and the active portion of the ninth transistor T9 is in a shape of straight line.

According to some exemplary embodiments, referring to FIG. 8B, the first gate metal layer may include a scanning signal line 15, a reset signal line 16, a third conductive portion 13 and a light-emitting control signal line 14.

For example, referring to FIG. 8A and FIG. 8B, a main body portion of the scanning signal line 15 extends in the first direction X. The scanning signal line 15 is used to provide a scanning signal. An orthographic projection of the scanning signal line 15 on the base substrate partially overlaps with an orthographic projection of the active portion of the first transistor T1 on the base substrate, and a portion of the scanning signal line 15 overlapping with the active portion of the first transistor T1 serves as the gate G1 of the first transistor T1, and a portion of the active portion of the first transistor T1 overlapping with the scanning signal line 15 serves as the channel portion CH1 of the first transistor T1. There are two overlaps between the orthographic projection of the scanning signal line 15 on the base substrate and the orthographic projection of the active portion of the second transistor T2 on the base substrate. Two portions of the scanning signal line 15 overlapping with the active portion of the second transistor T2 serve as the first gate G21 of the second transistor T2 and the second gate G22 of the second transistor T2, respectively. Two portions of the active portion of the second transistor T2 overlapping with the scanning signal line 15 serve as the first sub-channel portion CH21 of the second transistor T2 and the second sub-channel portion CH22 of the second transistor T2, respectively. A portion connected between the first sub-channel portion CH21 and the second sub-channel portion CH22 is a channel connection portion CH23. The first sub-channel portion CH21, the second sub-channel portion CH22 and the channel connection portion CH23 jointly serve as the channel portion CH2 of the second transistor T2.

For example, referring to FIG. 8A and FIG. 8B, a main body portion of the reset signal line 16 extends in the first direction X. The reset signal line 16 is used to transmit a reset signal. An orthographic projection of the reset signal line 16 on the base substrate partially overlaps with an orthographic projection of the active portion of the fifth transistor T5 on the base substrate. A portion of the reset signal line 16 overlapping with the active portion of the fifth transistor T5 serves as the gate G5 of the fifth transistor T5, and a portion of the active portion of the fifth transistor T5 overlapping with the reset signal line 16 serves as the channel portion CH5 of the fifth transistor T5. There are two overlaps between the orthographic projection of the reset signal line 16 on the base substrate and the orthographic projection of the active portion of the fourth transistor T4 on the base substrate. Two portions of the reset signal line 16 overlapping with the active portion of the fourth transistor T4 serve as the first gate G41 of the fourth transistor T4 and the second gate G42 of the fourth transistor T4, respectively. Two portions of the active portion of the fourth transistor T4 overlapping with the reset signal line 16 serve as the first sub-channel portion CH41 of the fourth transistor T4 and the second sub-channel portion CH42 of the fourth transistor T4, respectively. A portion connected between the first sub-channel portion CH41 and the second sub-channel portion CH42 is a channel connection portion CH43. The first sub-channel portion CH41, the second sub-channel portion CH42 and the channel connection portion CH43 jointly serve as the channel portion CH4 of the fourth transistor T4. The orthographic projection of the reset signal line 16 on the base substrate partially overlaps with an orthographic projection of the active portion of the eighth transistor T8 on the base substrate, a portion of the reset signal line 16 overlapping with the active portion of the eighth transistor T8 serves as a gate G8 of the eighth transistor T8, and a portion of the active portion of the eighth transistor T8 overlapping with the reset signal line 16 serves as the channel portion CH8 of the eighth transistor T8.

For example, referring to FIG. 8A and FIG. 8B, an orthographic projection of the third conductive portion 13 on the base substrate partially overlaps with an orthographic projection of the active portion of the third transistor T3 on the base substrate, and a portion of the third conductive portion 13 overlapping with the active portion of the third transistor T3 serves as the gate G3 of the third transistor T3, and a portion of the active portion of the third transistor T3 overlapping with the third conductive portion 13 serves as the channel portion CH3 of the third transistor T3. The third conductive portion 13 may be further used as a first electrode plate of the storage capacitor.

For example, referring to FIG. 8A and FIG. 8B, a main body portion of the light-emitting control signal line 14 extends in the first direction X. The light-emitting control signal line 14 is used to transmit a light-emitting control signal. An orthographic projection of the light-emitting control signal line 14 on the base substrate partially overlaps with an orthographic projection of the active portion of the sixth transistor T6 on the base substrate, a portion of the light-emitting control signal line 14 overlapping with the active portion of the sixth transistor T6 serves as the gate G6 of the sixth transistor T6, and a portion of the active portion of the sixth transistor T6 overlapping with the light-emitting control signal line 14 serves as the channel portion CH6 of the sixth transistor T6. An orthographic projection of the light-emitting control signal line 14 on the base substrate partially overlaps with an orthographic projection of the active portion of the seventh transistor T7 on the base substrate, a portion of the light-emitting control signal line 14 overlapping with the active portion of the seventh transistor T7 serves as the gate G7 of the seventh transistor T7, and a portion of the active portion of the seventh transistor T7 overlapping with the light-emitting control signal line 14 serves as the channel portion CH7 of the seventh transistor T7. An orthographic projection of the light-emitting control signal line 14 on the base substrate partially overlaps with an orthographic projection of the active portion of the ninth transistor T9 on the base substrate, a portion of the light-emitting control signal line 14 overlapping with the active portion of the ninth transistor T9 serves as the gate G9 of the ninth transistor T9, and a portion of the active portion of the ninth transistor T9 overlapping with the light-emitting control signal line 14 serves as the channel portion CH9 of the ninth transistor T9.

According to some exemplary embodiments, referring to FIG. 8C, the second gate metal layer may include the first power grid line 21, a fourth conductive portion 22, and a second initialization connection portion 23.

For example, referring to FIG. 8C, the first power grid line 21 extends in the first direction X, and the first power grid line 21 is used to transmit the first power signal.

For example, referring to FIG. 8B and FIG. 8C, an orthographic projection of the fourth conductive portion 22 on the base substrate at least partially overlaps with the orthographic projection of the third conductive portion 13 on the base substrate, and the fourth conductive portion 22 serves as a second electrode plate of the storage capacitor. The fourth conductive portion 22 has a hollow structure 221, and an orthographic projection of the hollow structure 221 on the base substrate falls within the orthographic projection of the third conductive portion 13 on the base substrate.

For example, referring to FIG. 8C, the second initialization connection portion 23 is in a shape of a strip extending in the second direction Y, and the second initialization connection portion 23 is electrically connected to other structure(s) arranged in an upper layer.

According to some exemplary embodiments, referring to FIG. 8D, the interlayer insulation layer includes a plurality of via holes. For example, the interlayer insulation layer includes a first via hole V11, a second via hole V12, a third via hole V13, a fourth via hole V14, a sixth via hole V16, a seventh via hole V17, an eighth via hole V18, a ninth via hole V19, a tenth via hole V20, an eleventh via hole V21, a twelfth via hole V22, a thirteenth via hole V23, a fourteenth via hole V24, a fifteenth via hole V25, a sixteenth via hole V26, and an eighteenth via hole V28.

According to some exemplary embodiments, referring to FIG. 8E, the first source and drain metal layer may include the first initialization signal line 31, the second initialization signal line 32, the reference voltage signal line 34, the second power grid line 36, the first initialization connection portion 371, the first power signal connection portion 372, the second transfer portion 373, a fourth connection structure 374, a fifth connection structure 375, and a sixth connection structure 376.

For example, referring to FIG. 8A, FIG. 8C, FIG. 8D and FIG. 8E, the first initialization signal line 31 extends in the first direction X, and the first initialization signal line 31 is used to transmit a first initialization signal. The first initialization signal line 31 is electrically connected to the second initialization connection portion 23 through the first via hole V11. The first initialization connection portion 371 is electrically connected to the second initialization connection portion 23 through the third via hole V13, and the first initialization connection portion 371 is electrically connected to the first electrode S4 of the fourth transistor T4 through the fourth via hole V14. That is, the first initialization signal line 31 is electrically connected to the first electrode S4 of the fourth transistor T4 through the second initialization connection portion 23 and the first initialization connection portion 371.

For example, referring to FIG. 8A, FIG. 8D and FIG. 8E, the second initialization signal line 32 extends in the first direction X, and the second initialization signal line 32 is used to transmit a second initialization signal. The second initialization signal line 32 is electrically connected to the first electrode S8 of the eighth transistor T8 through the second via hole V12.

For example, referring to FIG. 8A, FIG. 8D and FIG. 8E, the reference voltage signal line 34 extends in the first direction X, and the reference voltage signal line 34 is used to transmit a reference voltage signal. The reference voltage signal line 34 is electrically connected to the first electrode S5 of the fifth transistor T5 and the first electrode S6 of the sixth transistor T6 through the sixth via hole V16.

For example, referring to FIG. 8E, the second power grid line 36 extends in the first direction X, and the second power grid line 36 is used to transmit a second power signal.

For example, referring to FIG. 8A, FIG. 8C, FIG. 8D and FIG. 8E, the first power signal connection portion 372 extends in the second direction Y, the first power signal connection portion 372 is electrically connected to the first power grid line 21 through the seventh via hole V17 and the eighth via hole V18, and the first power signal connection portion 372 is electrically connected to the first electrode S3 of the third transistor T3 through the thirteenth via hole V23. That is, the first power grid line 21 is electrically connected to the first electrode S3 of the third transistor T3 through the first power signal connection portion 372.

For example, referring to FIG. 8A, FIG. 8D and FIG. 8E, the second transfer portion 373 is electrically connected to the second electrode D2 of the seventh transistor T7 through the eleventh via hole V21.

For example, referring to FIG. 8A to FIG. 8E, the fourth connection structure 374 is electrically connected to the first electrode S9 of the ninth transistor T9 through the tenth via hole V20, the fourth connection structure 374 is electrically connected to the gate G3 of the third transistor T3 through the fourth via hole V14 and the hollow structure 221 of the fourth conductive portion 22, and the fourth connection structure 374 is electrically connected to the second electrode D2 of the second transistor T2 through the fifteenth via hole V25. That is, the first electrode S9 of the ninth transistor T9, the gate G3 of the third transistor T3 and the second electrode D2 of the second transistor T2 are electrically connected to the same node through the fourth connection structure 374.

For example, in combination with reference to FIG. 8A, FIG. 8C, FIG. 8D and FIG. 8E, the fifth connection structure 375 is electrically connected to the second electrode D5 of the fifth transistor T5 and the second electrode D6 of the sixth transistor T6 through the ninth via hole V19, the fifth connection structure 375 is electrically connected to the fourth conductive portion 22 through the twelfth via hole V22, and the fifth connection structure 375 is electrically connected to the second electrode D1 of the first transistor T1 through the fifteenth via hole V25. That is, the second electrode D5 of the fifth transistor T5, the second electrode D6 of the sixth transistor T6, the second electrode plate of the storage capacitor and the second electrode D1 of the first transistor T1 are electrically connected to the same node through the fifth connection structure 375.

For example, referring to FIG. 8A, FIG. 8D and FIG. 8E, the sixth connection structure 376 is electrically connected to the first electrode S1 of the first transistor T1 through the eighteenth via hole V28.

According to some exemplary embodiments, referring to FIG. 8F, the passivation layer includes a first via hole V31, a second via hole V32, a third via hole V33, a fourth via hole V34, and a fifth via hole V35.

According to some exemplary embodiments, referring to FIG. 8G, the first planarization layer includes a first via hole V41, a second via hole V42, a third via hole V43, a fourth via hole V44, and a fifth via hole V45. Referring to FIG. 8F and FIG. 8G, the first via hole V41 is sleeved on the first via hole V31, that is, an orthographic projection of the first via hole V41 on the base substrate covers an orthographic projection of the first via hole V31 on the base substrate. The second via hole V42 is sleeved on the second via hole V32, that is, an orthographic projection of the second via hole V42 on the base substrate covers an orthographic projection of the second via hole V32 on the base substrate. The third via hole V43 is sleeved on the third via hole V33, that is, an orthographic projection of the third via hole V43 on the base substrate covers an orthographic projection of the third via hole V33 on the base substrate. The fourth via hole V44 is sleeved on the fourth via hole V34, that is, an orthographic projection of the fourth via hole V44 on the base substrate covers the orthographic projection of the fourth via hole V34 on the base substrate. The fifth via hole V45 is sleeved on the fifth via hole V35, that is, an orthographic projection of the fifth via hole V45 on the base substrate covers an orthographic projection of the fifth via hole V35 on the base substrate.

According to some exemplary embodiments, referring to FIG. 8H, the second source and drain metal layer may include a second power signal line 41, a grid line 42, a first power signal line 43, a data line 44, and a first electrode connection portion 45.

According to some exemplary embodiments, referring to FIG. 8E, FIG. 8F, FIG. 8G and FIG. 8H, the second power signal line 41 extends in the second direction Y, and the second power signal line 41 is used to transmit the second power signal. The second power signal line 41 is electrically connected to the second power grid line 36 through the fifth via hole V45 and the fifth via hole V35.

According to some exemplary embodiments, referring to FIG. 8E and FIG. 8H, the grid line 42 extends in the second direction Y. A portion of the grid line 42 may be electrically connected to the first initialization signal line 31, another portion of the grid line 42 may be electrically connected to the second initialization signal line 32, and yet another portion of the grid line 42 may be electrically connected to the reference voltage signal line 34.

According to some exemplary embodiments, referring to FIG. 8E, FIG. 8F, FIG. 8G and FIG. 8H, the first power signal line 43 extends in the second direction Y, and the first power signal line 43 is used to transmit a first power signal. The first power signal line 43 is electrically connected to the first power signal connection portion 372 through the third via hole V43, the third via hole V33, the second via hole V42 and the second via hole V32, that is, the first power signal line 43 is electrically connected to the first power grid line 21 through the first power signal connection portion 372.

According to some exemplary embodiments, with reference to FIG. 8E, FIG. 8F, FIG. 8G and FIG. 8H, the data line 44 extends in the second direction Y, and the data line 44 is used to transmit a data signal. The data line 44 is electrically connected to the sixth connection structure 376 through the fourth via hole V44 and the fourth via hole V34, that is, the data line 44 is electrically connected to the first electrode S1 of the first transistor T1 through the sixth connection structure 376.

According to some exemplary embodiments, with reference to FIG. 8E, FIG. 8F, FIG. 8G and FIG. 8H, the first electrode connection portion 45 is electrically connected to the third connection structure 373 through the first via hole V41 and the first via hole V31, that is, the first electrode connection portion 45 is electrically connected to the second electrode D2 of the seventh transistor T7 through the third connection structure 373, and the first electrode connection portion 45 is further used to be electrically connected to the first electrode located on an upper side.

According to some exemplary embodiments, the first gate metal layer, the second gate metal layer, the first source and drain metal layer, and the second source and drain metal layer may be made of metal material(s), such as any one or more of silver (Ag), copper (Cu), aluminum (Al) and molybdenum (Mo), or alloy material(s) of the above metals, such as aluminum-neodymium alloy (AlNd) or molybdenum-niobium alloy (MoNb), and they may have a single-layer structure, or a multi-layer composite structure, such as Mo/Cu/Mo, etc. The first gate insulation layer, the second gate insulation layer, the interlayer insulation layer and the passivation layer may be made of any one or more of silicon oxide (SiOx), silicon nitride (SiNx) and silicon oxynitride (SiON), and may have a single-layer, multi-layer or composite layer structure. The first planarization layer and the second planarization layer may be made of organic material (s), such as resin, etc.

At least some embodiments of the present disclosure further provide a display device, which includes the display substrate as described above. The display device may include any device or product having a display function. For example, the display device may be a smart phone, a mobile phone, an e-book reader, a desktop computer (PC), a laptop PC, a netbook PC, a personal digital assistant (PDA), a portable multimedia player (PMP), a digital audio player, a mobile medical device, a camera, a wearable device (such as a head-mounted device, an electronic clothing, an electronic bracelet, an electronic necklace, an electronic accessory, an electronic tattoo, or a smart watch), a television, etc.

It will be understood that the display panel and the display device according to embodiments of the present disclosure has all the characteristics and advantages of the above-mentioned display substrate. Details may be referred back to the above description and will not be repeated here. Although the overall technical concept of the present disclosure is shown and described in some embodiments, those skilled in the art will appreciate that changes may be made to these embodiments without departing from the principles and spirit of the overall technical concept, and the scope of the present disclosure is defined by the claims and their equivalents.

What is claimed is:

1. A display substrate, comprising:

a base substrate;

a plurality of sub-pixels on the base substrate, arranged in a first direction and/or a second direction, the first direction intersecting with the second direction, wherein the sub-pixels comprise a light-emitting element and a driving circuit electrically connected to the light-emitting element;

a first initialization signal transmission structure on the base substrate, electrically connected to the driving circuit and configured to provide a first initialization signal to the driving circuit;

a second initialization signal transmission structure on the base substrate, electrically connected to the driving circuit and configured to provide a second initialization signal to the driving circuit;

a reference voltage signal transmission structure on the base substrate, electrically connected to the driving circuit and configured to provide a reference voltage signal to the driving circuit; and a second power signal transmission structure on the base substrate, electrically connected to a second electrode of the light-emitting element and configured to provide a second power signal to the second electrode of the light-emitting element, wherein an orthographic projection of at least one of the first initialization signal transmission structure, the second initialization signal transmission structure, the reference voltage signal transmission structure or the second power signal transmission structure on the base substrate is in a shape of a grid, wherein the display substrate further comprises a first conductive layer on the base substrate and a second conductive layer between the first conductive layer and the base substrate;

wherein the first initialization signal transmission structure comprises a plurality of first initialization signal lines in the second conductive layer and a plurality of first initialization grid lines in the first conductive layer, the plurality of first initialization signal lines extend in the first direction and are arranged in the second direction, the plurality of first initialization grid lines extend in the second direction and are arranged in the first direction, and the first initialization grid line is electrically connected to at least one first initialization signal line; and/or wherein the second initialization signal transmission structure comprises a plurality of second initialization signal lines in the second conductive layer and a plurality of second initialization grid lines in the first conductive layer, the plurality of second initialization signal lines extend in the first direction and are arranged in the second direction, the plurality of second initialization grid lines extend in the second direction and are arranged in the first direction, and the second initialization grid line is electrically connected to at least one second initialization signal line; and/or wherein the reference voltage signal transmission structure comprises a plurality of reference voltage signal lines in the second conductive layer and a plurality of reference voltage grid lines in the first conductive layer, the plurality of reference voltage signal lines extend in the first direction and are arranged in the second direction, the plurality of reference voltage grid lines extend in the second direction and are arranged in the first direction, and the reference voltage grid line is electrically connected to at least one reference voltage signal line; and/or wherein the second power signal transmission structure comprises a plurality of second power signal lines in the first conductive layer and a plurality of second power grid lines in the second conductive layer, the plurality of second power signal lines extend in the second direction and are arranged in the first direction, the plurality of second power grid lines extend in the first direction and are arranged in the second direction, and the second power grid line is electrically connected to at least one second power signal line, and wherein the second conductive layer comprises a plurality of second wiring sets arranged in the second direction, and the second wiring set comprises one first initialization signal line, one second initialization signal line, one reference voltage signal line and one second power grid line that are arranged in the second direction.

2. The display substrate according to claim 1, wherein the first conductive layer comprises a plurality of first wiring sets arranged in the first direction, the first wiring set comprises three second power signal lines and three grid lines, the three second power signal lines and the three grid lines are alternately arranged in the first direction, and the three grid lines comprise one first initialization grid line, one second initialization grid line, and one reference voltage grid line.

3. The display substrate according to claim 2, wherein the first wiring set comprises three first wiring sub-sets arranged in the first direction, and the first wiring sub-set comprises one second power signal line and one grid line; and wherein the first wiring sub-set further comprises one first power signal line and one data line, and the first power signal line and the data line are arranged on a side of the grid line and the second power signal line in the first direction.

4. The display substrate according to claim 1, wherein the first conductive layer comprises a plurality of first wiring sets arranged in the first direction, the first wiring set comprises one second power signal line and three grid lines, and the three grid lines comprise one first initialization grid line, one second initialization grid line, and one reference voltage grid line; and wherein the second power signal line is arranged on a side of the three grid lines in the first direction, or the second power signal line is arranged between two of the three grid lines.

5. The display substrate according to claim 4, wherein the first wiring set comprises three first wiring sub-sets arranged in the first direction, each of two first wiring sub-sets among the three first wiring sub-sets comprises one grid line, and a remaining one of the three first wiring sub-sets comprises one grid line and one second power signal line; and wherein the first wiring sub-set further comprises one first power signal line and one data line, and the first power signal line and the data line are arranged on a side of the grid line in the first direction; or the first power signal line and the data line are arranged on a side of the grid line and the second power signal line in the first direction.

6. The display substrate according to claim 1, further comprising a first power signal transmission structure on the base substrate, wherein the first power signal transmission structure is electrically connected to the driving circuit and is configured to provide a first power signal to the driving circuit, and an orthographic projection of the first power signal transmission structure on the base substrate is in a shape of a grid.

7. The display substrate according to claim 6, wherein the display substrate further comprises a third conductive layer between the second conductive layer and the base substrate;

wherein the first power signal transmission structure comprises a plurality of first power signal lines in the first conductive layer, a plurality of first power signal connection portions in the second conductive layer and a plurality of first power grid lines in the third conductive layer, the plurality of first power signal lines are arranged in the first direction and extend in the second direction, and the plurality of first power grid lines are arranged in the second direction and extend in the first direction; and wherein the first power grid line is electrically connected to at least one first power signal line through at least one first power signal connection portion, and the first power signal connection portion is electrically connected to the driving circuit and is configured to provide the first power signal to the driving circuit.

8. The display substrate according to claim 7, wherein an orthographic projection of the first power signal connection portion on the base substrate falls within an orthographic projection of the first power signal line on the base substrate.

9. The display substrate according to claim 1, wherein the driving circuit comprises a first transistor, a second transistor, a third transistor and a first storage capacitor;

a first electrode of the first transistor is configured to receive a data signal, and a second electrode of the first transistor is electrically connected to a second electrode plate of the first storage capacitor;

a first electrode of the second transistor is electrically connected to a second electrode of the third transistor, and a second electrode of the second transistor is electrically connected to a gate of the third transistor; and a first electrode of the third transistor is configured to receive a first power signal, and the gate of the third transistor is electrically connected to a first electrode plate of the first storage capacitor, wherein each of a gate of the first transistor and a gate of the second transistor is configured to receive a scanning signal.

10. The display substrate according to claim 9, wherein the display substrate further comprises a fourth conductive layer between the second conductive layer and the base substrate, the gate of the first transistor and the gate of the second transistor are arranged in the fourth conductive layer; and wherein the display substrate further comprises a scanning signal line in the second conductive layer, the scanning signal line is electrically connected to each of the gate of the first transistor and the gate of the second transistor, and the scanning signal line is configured to provide the scanning signal to each of the gate of the first transistor and the gate of the second transistor.

11. The display substrate according to claim 9, wherein the driving circuit further comprises a fourth transistor, a fifth transistor, and an eighth transistor;

a first electrode of the fourth transistor is configured to receive the first initialization signal, and a second electrode of the fourth transistor is electrically connected to the gate of the third transistor;

a first electrode of the fifth transistor is configured to receive the reference voltage signal, and a second electrode of the fifth transistor is electrically connected to the second electrode of the first transistor;

a first electrode of the eighth transistor is configured to receive the second initialization signal, and a second electrode of the eighth transistor is electrically connected to a first electrode of the light-emitting element, wherein each of a gate of the fourth transistor, a gate of the fifth transistor and a gate of the eighth transistor is configured to receive a reset signal.

12. The display substrate according to claim 11, wherein the display substrate further comprises a fourth conductive layer between the second conductive layer and the base substrate, the gate of the fourth transistor, the gate of the fifth transistor and the gate of the eighth transistor are arranged in the fourth conductive layer; and wherein the display substrate further comprises a reset signal line in the second conductive layer, the reset signal line is electrically connected to each of the gate of the fourth transistor, the gate of the fifth transistor and the gate of the eighth transistor, and the reset signal line is configured to provide the reset signal to each of the gate of the fourth transistor, the gate of the fifth transistor and the gate of the eighth transistor.

13. The display substrate according to claim 9, wherein the plurality of sub-pixels comprise a first sub-pixel, a second sub-pixel and a third sub-pixel, the first sub-pixel comprises a first driving circuit and a first light-emitting element electrically connected to the first driving circuit, the second sub-pixel comprises a second driving circuit and a second light-emitting element electrically connected to the second driving circuit, and the third sub-pixel comprises a third driving circuit and a third light-emitting element electrically connected to the third driving circuit;

wherein an active portion of the third transistor comprises a channel portion, a first electrode and a second electrode, and the first electrode of the active portion and the second electrode of the active portion are respectively connected to the channel portion on opposite sides of the channel portion in the first direction;

wherein the third transistor in the first driving circuit comprises a first channel portion, the third transistor in the second driving circuit comprises a second channel portion, and the third transistor in the third driving circuit comprises a third channel portion, and wherein a ratio of a size of the first channel portion in the first direction to a size of the first channel portion in the second direction is different from a ratio of a size of the second channel portion in the first direction to a size of the second channel portion in the second direction; and/or the ratio of the size of the first channel portion in the first direction to the size of the first channel portion in the second direction is different from a ratio of a size of the third channel portion in the first direction to a size of the third channel portion in the second direction; and/or the ratio of the size of the second channel portion in the first direction to the size of the second channel portion in the second direction is different from the ratio of the size of the third channel portion in the first direction to the size of the third channel portion in the second direction.

14. The display substrate according to claim 13, wherein the first light-emitting element emits red light, the second light-emitting element emits green light, and the third light-emitting element emits blue light, wherein the ratio of the size of the third channel portion in the first direction to the size of the third channel portion in the second direction is greater than the ratio of the size of the first channel portion in the first direction to the size of the first channel portion in the second direction; and/or wherein the ratio of the size of the third channel portion in the first direction to the size of the third channel portion in the second direction is greater than the ratio of the size of the second channel portion in the first direction to the size of the second channel portion in the second direction.

15. The display substrate according to claim 14, wherein the size of the third channel portion in the first direction is equal to the size of the first channel portion in the first direction, and the size of the third channel portion in the second direction is less than the size of the first channel portion in the second direction; and/or the size of the third channel portion in the first direction is equal to the size of the second channel portion in the first direction, and the size of the third channel portion in the second direction is less than the size of the second channel portion in the second direction.

16. The display substrate according to claim 1, wherein the display substrate further comprises an insulation layer on a side of the second conductive layer away from the base substrate, a first conductive layer on a side of the insulation layer away from the base substrate, wherein the first conductive layer is located on a side of the insulation layer away from the base substrate, wherein the first electrode layer comprises a plurality of first electrodes, the first electrode comprises a first electrode main body portion and a first electrode connection portion connected to the first electrode main body portion;

the first conductive layer comprises a plurality of first transfer portions, the second conductive layer comprises a plurality of second transfer portions, and the insulation layer comprises a plurality of via holes, each of the plurality of via holes exposes at least part of a respective one of the plurality of second transfer portions; and the first electrode connection portion is electrically connected to the first transfer portion, the first transfer portion is electrically connected to the second transfer portion through the via hole, and the second transfer portion is electrically connected to the driving circuit, wherein orthographic projections of the plurality of first electrode main body portions on the base substrate cover at least part of orthographic projections of the plurality of via holes on the base substrate; and/or the orthographic projections of the plurality of first electrode main body portions on the base substrate cover at least part of orthographic projections of the plurality of first transfer portions on the base substrate; and/or the orthographic projections of the plurality of first electrode main body portions on the base substrate cover at least part of orthographic projections of the plurality of second transfer portions on the base substrate.

17. The display substrate according to claim 16, wherein the plurality of first electrodes comprise a plurality of first sub-electrodes, a plurality of second sub-electrodes and a plurality of third sub-electrodes, and the plurality of first transfer portions comprise a plurality of first transfer sub-portions, a plurality of second transfer sub-portions and a plurality of third transfer sub-portions;

the first sub-electrode and the third sub-electrode are spaced apart from each other in the second direction, and the second sub-electrode is arranged on a side of the first sub-electrode and the third sub-electrode in the first direction;

the first sub-electrode comprises a first sub-electrode main body portion and a first sub-electrode connection portion connected to an edge of the first sub-electrode main body portion facing the third sub-electrode, one end of the first transfer sub-portion is electrically connected to the first sub-electrode connection portion, and the other end of the first transfer sub-portion extends in the second direction and is electrically connected to the second transfer portion;

the second sub-electrode comprises a second sub-electrode main body portion and a second sub-electrode connection portion connected to an edge of the second sub-electrode main body portion facing the first sub-electrode and the third sub-electrode, one end of the second transfer sub-portion is electrically connected to the second sub-electrode connection portion, and the other end of the second transfer sub-portion extends in the second direction and is electrically connected to the second transfer portion; and the third sub-electrode comprises a third sub-electrode main body portion and a third sub-electrode connection portion connected to a corner portion of the third sub-electrode main body portion, the corner portion of the third sub-electrode main body portion is on a side of the third sub-electrode main body portion away from the first sub-electrode and facing the second sub-electrode, the third sub-electrode connection portion extends in the first direction and is electrically connected to one end of the third transfer sub-portion, and the other end of the third transfer sub-portion extends in the second direction and is electrically connected to the second transfer portion, wherein an orthographic projection of the second transfer portion electrically connected to the first transfer sub-portion on the base substrate falls within an orthographic projection of the third sub-electrode main body portion on the base substrate; and an orthographic projection of the second transfer portion electrically connected to the third transfer sub-portion on the base substrate falls within an orthographic projection of the second sub-electrode main body portion on the base substrate.

18. A display device, comprising the display substrate according to claim 1.

* * * * *